United States Patent
Lopez-Julia et al.

(10) Patent No.: US 11,869,923 B2
(45) Date of Patent: Jan. 9, 2024

(54) LIGHT-EMITTING ARRAY WITH DIELECTRIC LIGHT COLLECTION STRUCTURES

(71) Applicant: LUMILEDS LLC, San Jose, CA (US)

(72) Inventors: Antonio Lopez-Julia, Aachen (DE); Aimi Abass, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/991,354

(22) Filed: Nov. 21, 2022

(65) Prior Publication Data

US 2023/0187470 A1 Jun. 15, 2023

Related U.S. Application Data

(60) Provisional application No. 63/289,285, filed on Dec. 14, 2021.

(51) Int. Cl.
*H01L 27/15* (2006.01)
*G09G 3/32* (2016.01)

(52) U.S. Cl.
CPC ........... *H01L 27/156* (2013.01); *G09G 3/32* (2013.01); *G09G 2300/0426* (2013.01); *G09G 2320/0626* (2013.01)

(58) Field of Classification Search
CPC ..... H01L 33/405; H01L 33/44; H01L 27/156; H01L 33/42; H01L 33/385; H01L 2933/0091; H01L 2933/0083; H01L 33/46; H01L 33/62; G09G 3/32; G09G 2320/0626; G09G 2300/0426

See application file for complete search history.

(56) References Cited

U.S. PATENT DOCUMENTS

| | | | |
|---|---|---|---|
| 8,026,524 B2* | 9/2011 | Shum | H01L 33/38 257/88 |
| 8,114,690 B2* | 2/2012 | Shum | H01L 33/385 438/42 |
| 9,318,530 B2* | 4/2016 | Jang | H01L 33/42 |

(Continued)

OTHER PUBLICATIONS

From KIPO as the ISA, Notification of Transmittal of the International Search Report and the Written Opinion of the International Searching Authority, or the Declaration, PCT/US2022/050715, dated Apr. 3, 2023, 10 pages.

*Primary Examiner* — Vinh T Lam

(57) ABSTRACT

A light-emitting array includes a semiconductor LED structure, multiple transparent dielectric bodies, a set of multiple, independent first electrical contacts, and a set of second electrical contacts. The LED structure extends contiguously over the array. The second electrical contacts are in electrical contact with the second semiconductor layer. Each dielectric body protrudes away from the first semiconductor layer and has on its surface an electrically conductive layer in electrical contact with the first semiconductor layer, forming a portion of a corresponding one of the first electrical contacts. Each dielectric body and corresponding first electrical contact define a corresponding discrete, circumscribed pixel region within the contiguous area of the array, each pixel region separate from the others. Some light emitted in the pixel region propagates into the dielectric body, undergoes internal reflection(s) within the dielectric body, and propagates out of the array through the dielectric body and diode structure.

20 Claims, 20 Drawing Sheets

(56) References Cited

U.S. PATENT DOCUMENTS

| | | | | |
|---|---|---|---|---|
| 10,355,174 B2* | 7/2019 | Maute | | H01L 33/62 |
| 11,099,393 B2* | 8/2021 | Scheller | | H01L 33/14 |
| 11,158,761 B2* | 10/2021 | Lutgen | | H01L 33/025 |
| 11,164,995 B2* | 11/2021 | Thompson | | H01L 33/20 |
| 11,239,399 B2* | 2/2022 | Morris | | G06F 1/1694 |
| 11,271,143 B2* | 3/2022 | Kreiner | | H01L 33/505 |
| 11,349,052 B2* | 5/2022 | Morris | | G06F 1/1694 |
| 11,349,053 B1* | 5/2022 | Chio | | C09J 9/02 |
| 11,355,480 B1* | 6/2022 | Valentine | | H01L 33/58 |
| 11,355,665 B2* | 6/2022 | Fabien | | G02B 3/3233 |
| 11,355,666 B2* | 6/2022 | Lutgen | | G02B 27/0093 |
| 11,362,251 B2* | 6/2022 | Pendse | | H01L 33/642 |
| 11,417,792 B1* | 8/2022 | Sengül | | H01L 24/81 |
| 11,424,214 B1* | 8/2022 | Brodoceanu | | H01L 27/156 |
| 11,430,658 B2* | 8/2022 | Lutgen | | H01L 33/0066 |
| 11,521,543 B2* | 12/2022 | Morris | | H01L 25/0753 |
| 11,532,664 B2* | 12/2022 | Chae | | H01L 33/10 |
| 11,563,148 B2* | 1/2023 | Lopez | | H01L 33/60 |
| 11,569,091 B2* | 1/2023 | Lutgen | | G02B 26/0833 |
| 11,569,414 B2* | 1/2023 | Shakoor | | H01L 33/382 |
| 11,631,784 B2* | 4/2023 | Thompson | | H01L 33/0062 |
| | | | | 257/99 |
| 11,658,260 B2* | 5/2023 | Batude | | H01L 33/62 |
| | | | | 438/22 |
| 11,664,407 B2* | 5/2023 | Andrews | | H01L 33/32 |
| | | | | 257/88 |
| 11,682,752 B2* | 6/2023 | Lopez | | H01L 27/156 |
| | | | | 345/82 |
| 11,688,829 B2* | 6/2023 | Tan | | H01L 33/16 |
| | | | | 257/79 |
| 11,705,479 B2* | 7/2023 | Choi | | H01L 25/167 |
| | | | | 257/89 |
| 11,721,797 B2* | 8/2023 | Chaji | | H01L 33/44 |
| | | | | 257/13 |
| 2011/0024782 A1* | 2/2011 | Shum | | H01L 33/06 |
| | | | | 257/E33.062 |
| 2011/0089446 A1* | 4/2011 | Ku | | H01L 33/46 |
| | | | | 257/98 |
| 2011/0156616 A1 | 6/2011 | Anderson et al. | | |
| 2012/0119237 A1* | 5/2012 | Leatherdale | | H01L 27/156 |
| | | | | 257/E33.006 |
| 2012/0178194 A1* | 7/2012 | Ray | | H01L 21/20 |
| | | | | 257/E33.068 |
| 2014/0124806 A1* | 5/2014 | Lester | | H01L 33/46 |
| | | | | 257/98 |
| 2016/0190396 A1* | 6/2016 | Lee | | H01L 33/32 |
| | | | | 257/13 |
| 2016/0284927 A1 | 9/2016 | Cho et al. | | |
| 2017/0358562 A1* | 12/2017 | Banna | | H01L 25/50 |
| 2019/0165038 A1* | 5/2019 | Chae | | H01L 33/504 |
| 2019/0273070 A1 | 9/2019 | Edmond et al. | | |
| 2021/0288032 A1* | 9/2021 | Pendse | | H01L 21/6835 |
| 2021/0288036 A1* | 9/2021 | Pendse | | H01L 33/0095 |
| 2021/0288223 A1* | 9/2021 | Young | | H01L 33/24 |
| 2021/0358997 A1 | 11/2021 | Lopez et al. | | |
| 2022/0059738 A1* | 2/2022 | Bieberdorf | | H01L 33/504 |
| 2022/0181515 A1* | 6/2022 | Lopez | | H01L 33/08 |
| 2022/0208848 A1* | 6/2022 | Tan | | H01L 21/306 |
| 2022/0262981 A1* | 8/2022 | Shakoor | | H01L 33/005 |
| 2022/0285425 A1* | 9/2022 | Young | | H01L 33/44 |
| 2022/0328740 A1* | 10/2022 | Pendse | | H01L 24/96 |
| 2022/0384516 A1* | 12/2022 | Tan | | H01L 27/156 |
| 2023/0131918 A1* | 4/2023 | Tonkikh | | H01L 33/12 |
| | | | | 257/13 |
| 2023/0163156 A1* | 5/2023 | Tan | | H01L 33/38 |
| | | | | 257/89 |
| 2023/0223421 A1* | 7/2023 | Pinos | | H01L 33/24 |
| | | | | 257/91 |

\* cited by examiner

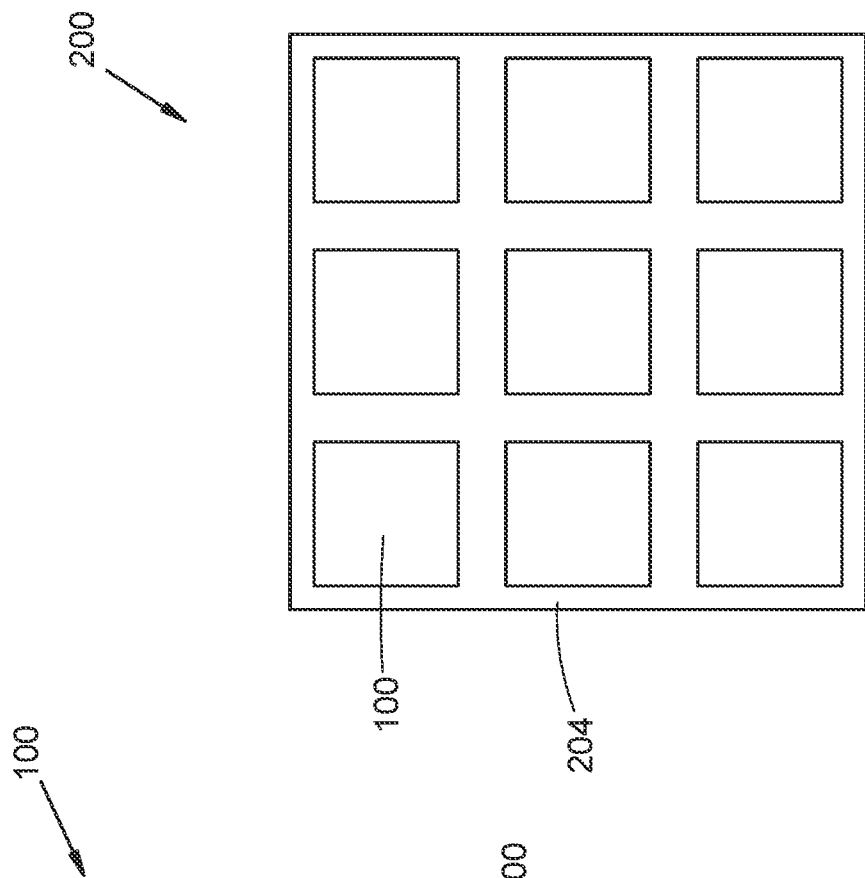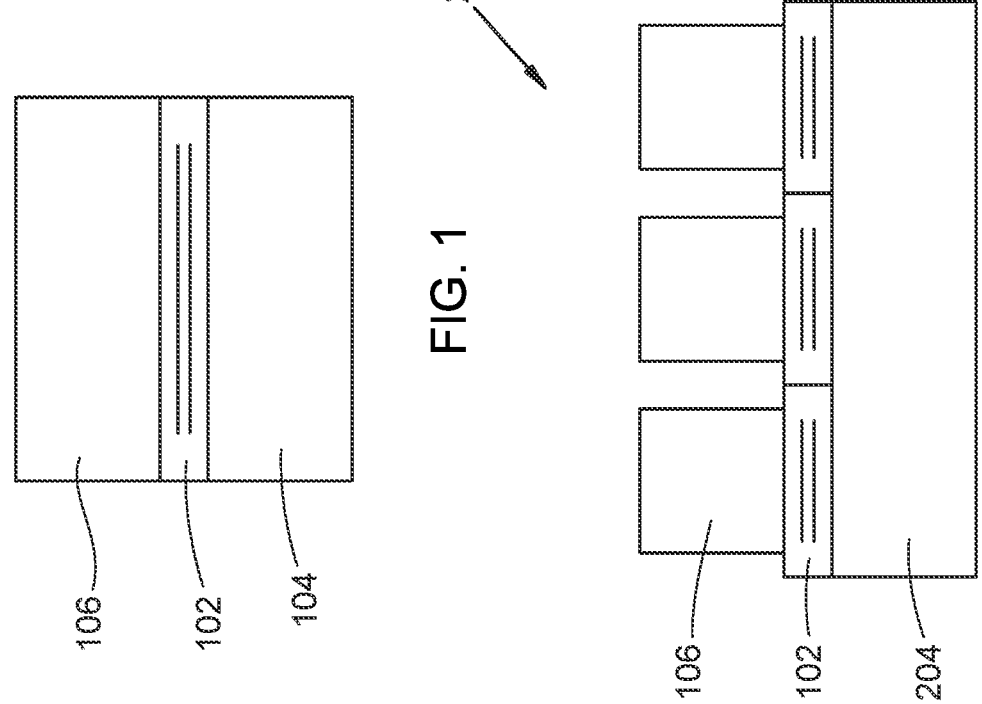

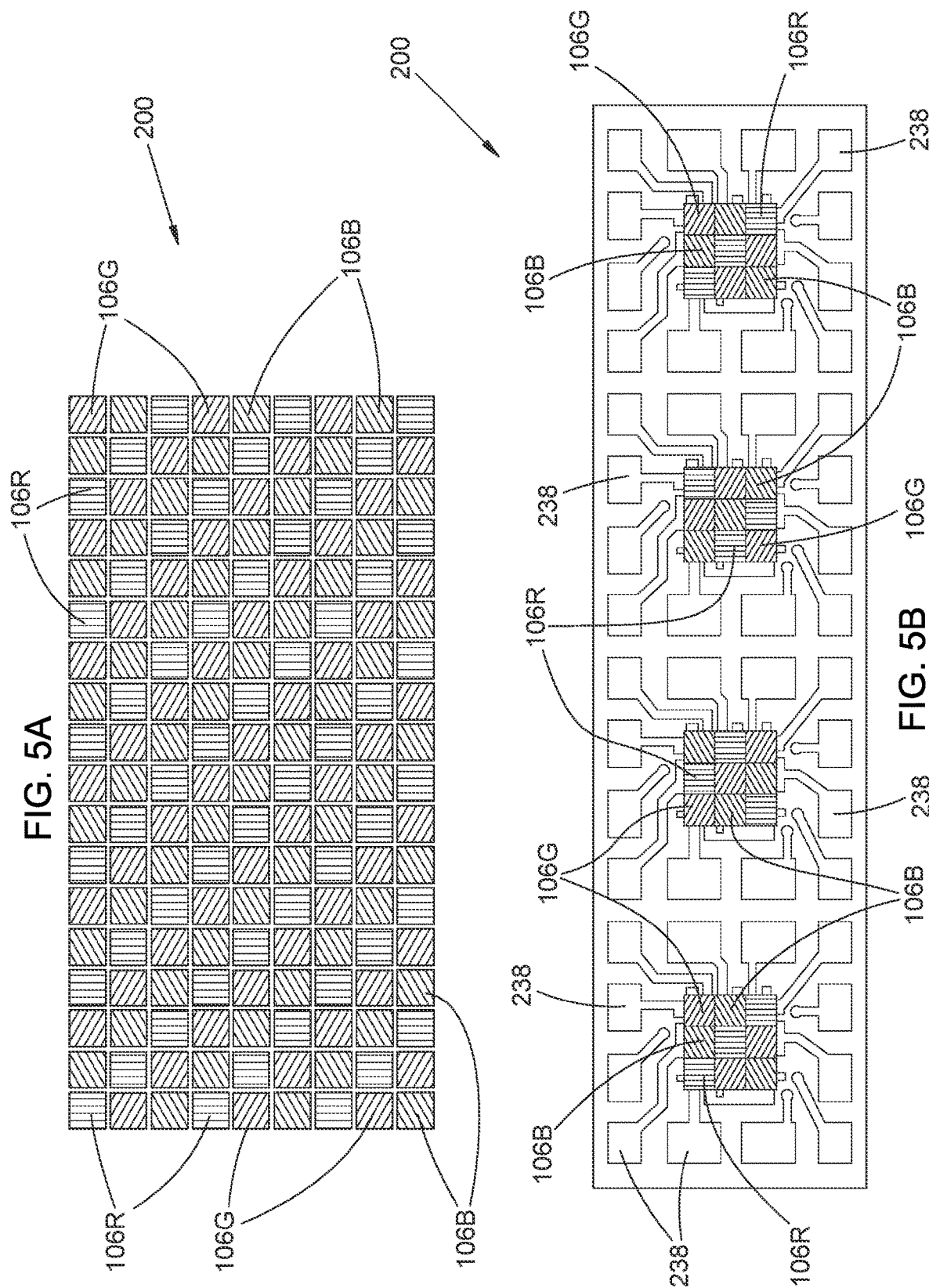

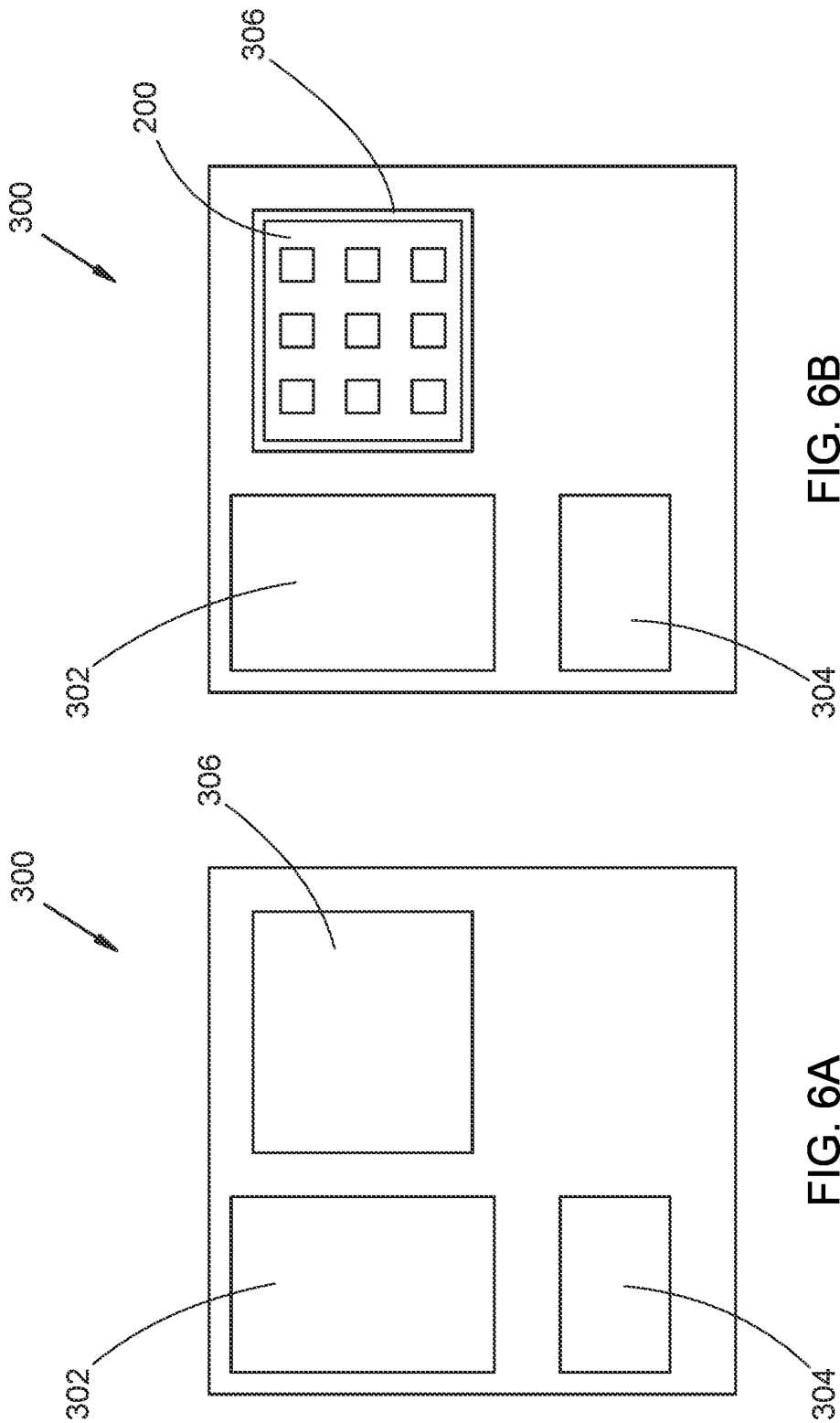

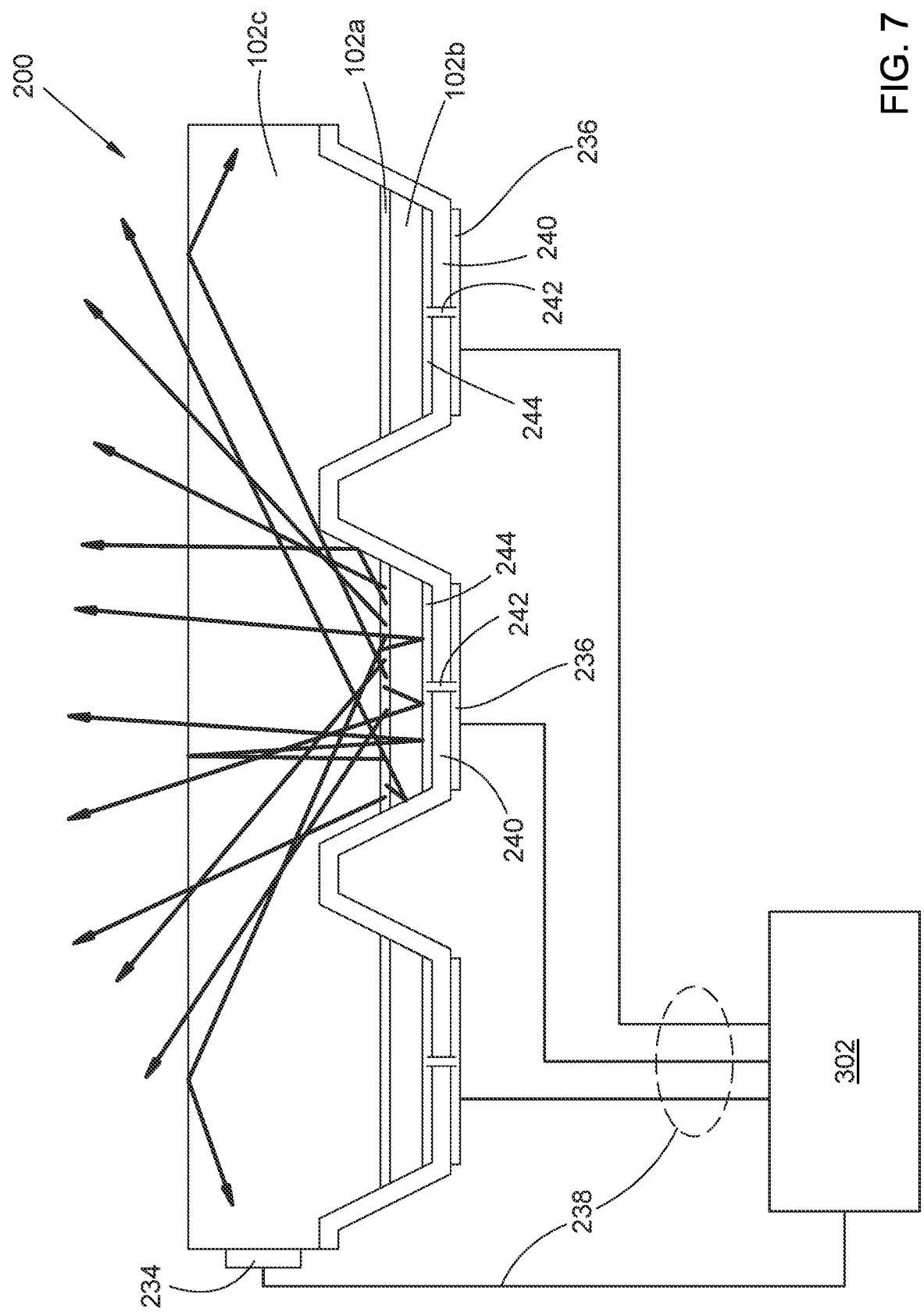

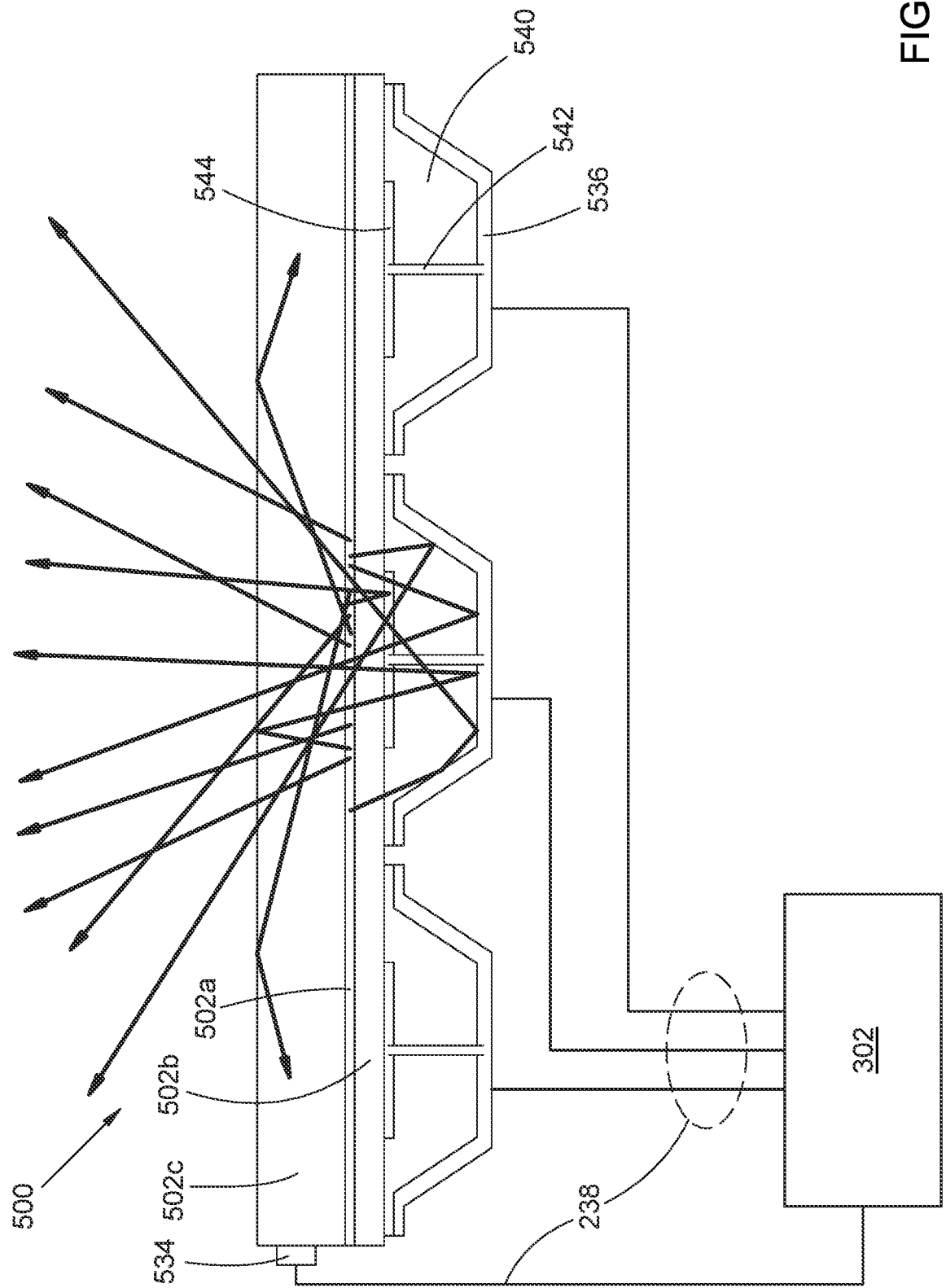

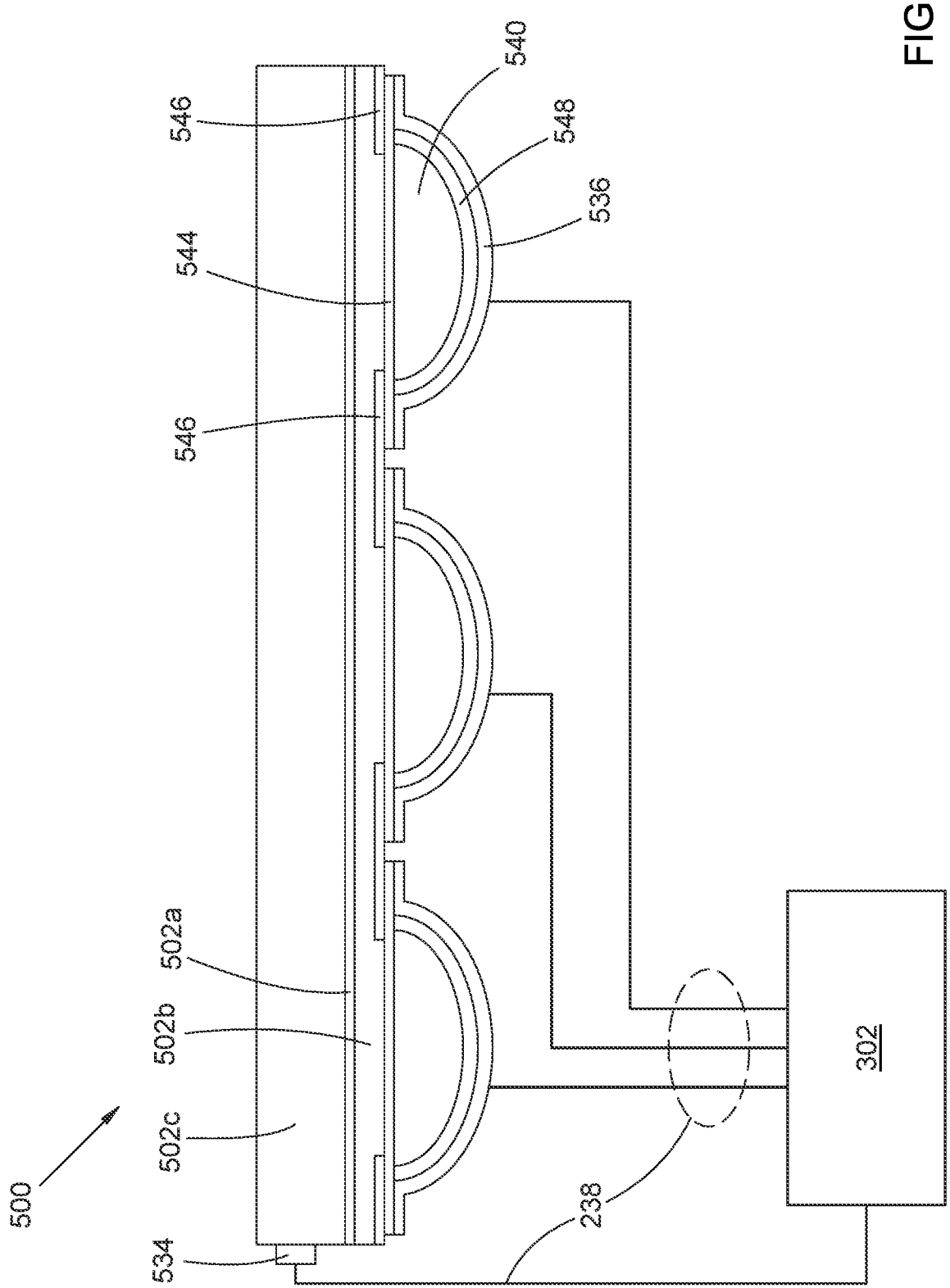

LIGHT-EMITTING ARRAY WITH DIELECTRIC LIGHT COLLECTION STRUCTURES

BENEFIT CLAIM

This application claims benefit of U.S. provisional App. No. 63/289,285 entitled "Light-emitting array with dielectric light collection structures" filed 14 Dec. 2021 in the names of Lopez-Julia et al; said application is incorporated herein by reference in its entirety.

FIELD OF THE INVENTION

The invention relates generally to light emitting diodes and to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, street lighting, camera flash sources, or flashlights (i.e., torches). An array having one or several or many individual devices per millimeter (e.g., device pitch or spacing of about a millimeter, a few hundred microns, or less than 100 microns, and separation between adjacent devices less than 100 microns or only a few tens of microns or less) typically is referred to as a miniLED array or a microLED array (alternatively, a µLED array). Such mini- or microLED arrays can in many instances also include phosphor converters as described above; such arrays can be referred to as pc-miniLED or pc-microLED arrays.

SUMMARY

An inventive semiconductor light-emitting array includes a semiconductor light-emitting diode structure, multiple transparent dielectric bodies, and multiple, independent first electrical contacts, and second electrical contacts. The diode structure includes first and second doped semiconductor layers and a junction or active layer between them. The diode structure emits light at a nominal emission vacuum wavelength $\lambda_0$ resulting from carrier recombination at the junction or active layer. The first and second semiconductor layers and the junction or active layer are coextensive over a contiguous area of the array. The second electrical contacts are in electrical contact with the second semiconductor layer. Each of the multiple transparent dielectric bodies protrudes away from the first semiconductor layer from a first surface thereof opposite the second semiconductor layer. A corresponding electrically conductive layer is formed on the surface of each dielectric body opposite the first semiconductor layer. Each electrically conductive layer is in electrical contact with the first semiconductor layer at its first surface thereof, and so forms at least a portion of a corresponding one of the first electrical contacts. Each dielectric body and the corresponding first electrical contact define a corresponding discrete, circumscribed pixel region within the contiguous area of the array; each pixel region is separated from other circumscribed pixel regions of the array. Each dielectric body is arranged so that some of the light emitted from the junction or active layer in the corresponding pixel region propagates into the first semiconductor layer and into the dielectric body, undergoes one or more internal reflections within the dielectric body, and propagates through the dielectric body, through the first and second semiconductor layers, and out of the second semiconductor layer away from the first semiconductor layer.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 shows a schematic cross-sectional view of an example pcLED.

FIGS. 2A and 2B show, respectively, cross-sectional and top schematic views of an example array of pcLEDs.

FIG. 5A is a schematic top view of a portion of an example LED display in which each display pixel is a red, green, or blue phosphor-converted LED pixel. FIG. 5B is a schematic top view of a portion of an example LED display in which each display pixel includes multiple phosphor-converted LED pixels (red, green, and blue) integrated onto a single die that is bonded to a control circuit backplane.

FIG. 6A shows a schematic top view an example electronics board on which an array of pcLEDs may be mounted, and FIG. 6B similarly shows an example array of pcLEDs mounted on the electronic board of FIG. 6A.

FIG. 7 is a schematic cross-sectional view of a light-emitting array with etch active layers.

FIGS. 8-15 are schematic cross-sectional views of various examples of inventive light-emitting arrays each having a contiguous active layer.

Figure 3A:
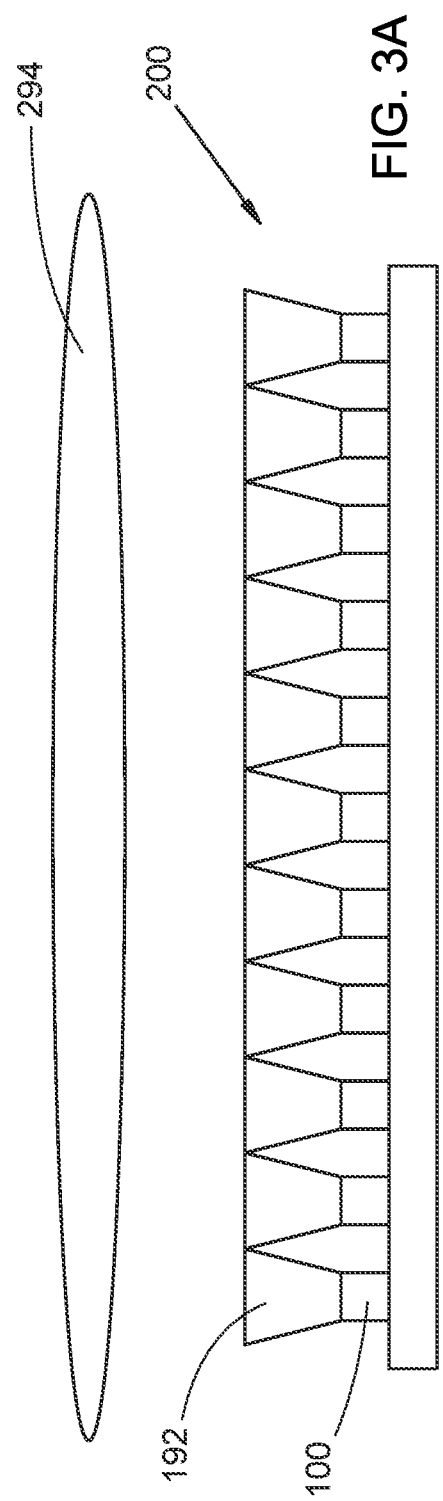
FIG. 3A shows a schematic cross-sectional view of an example array of pcLEDs arranged with respect to waveguides and a projection lens.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter. For purposes of simplicity and clarity, detailed descriptions of well-known devices, circuits, and methods may be omitted so as not to obscure the description of the inventive subject matter with unnecessary detail.

FIG. 1 shows an example of an individual pcLED 100 comprising a semiconductor diode structure 102 disposed on a substrate 104, together considered herein an "LED" or "semiconductor LED", and a wavelength converting structure (e.g., phosphor layer) 106 disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, other binary, ternary, or quaternary alloys of gallium, aluminum, indium, nitrogen, phosphorus, or arsenic, or II-VI materials.

Any suitable phosphor materials may be used for or incorporated into the wavelength converting structure 106, depending on the desired optical output from the pcLED.

FIGS. 2A-2B show, respectively, cross-sectional and top views of an array 200 of pcLEDs 100, each including a phosphor pixel 106, disposed on a substrate 204. Such an array can include any suitable number of pcLEDs arranged in any suitable manner. In the illustrated example the array is depicted as formed monolithically on a shared substrate, but alternatively an array of pcLEDs can be formed from separate individual pcLEDs (e.g., singulated devices that are assembled onto an array substrate). Individual phosphor pixels 106 are shown in the illustrated example, but alternatively a contiguous layer of phosphor material can be disposed across multiple LEDs 102. In some instances the array 200 can include light barriers (e.g., reflective, scattering, and/or absorbing) between adjacent LEDs 102, phosphor pixels 106, or both. Substrate 204 may optionally include electrical traces or interconnects, or CMOS or other circuitry for driving the LED, and may be formed from any suitable materials.

Figure 3B:
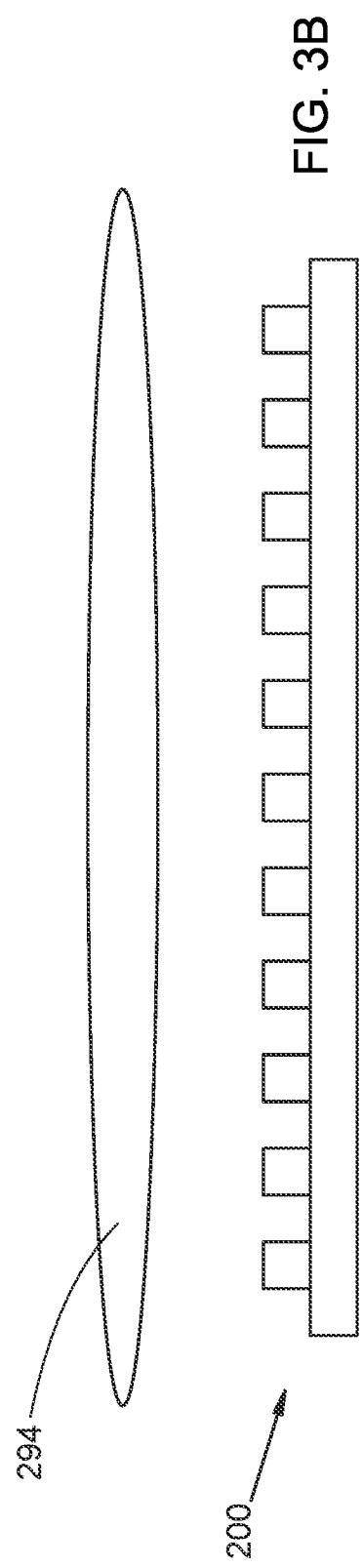
FIG. 3B shows an arrangement similar to that of FIG. 3A, but without the waveguides.

Individual pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights or other adaptive illumination sources. Other primary or secondary optical elements of any suitable type or arrangement can be included for each pixel, as needed or desired. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications or other illumination sources. A miniLED or microLED display application may use similar optical arrangements to those depicted in FIGS. 3A and 3B, for example. Generally, any suitable arrangement of optical elements (primary, secondary, or both) can be used in combination with the pcLEDs described herein, depending on the desired application.

Figure 4A:
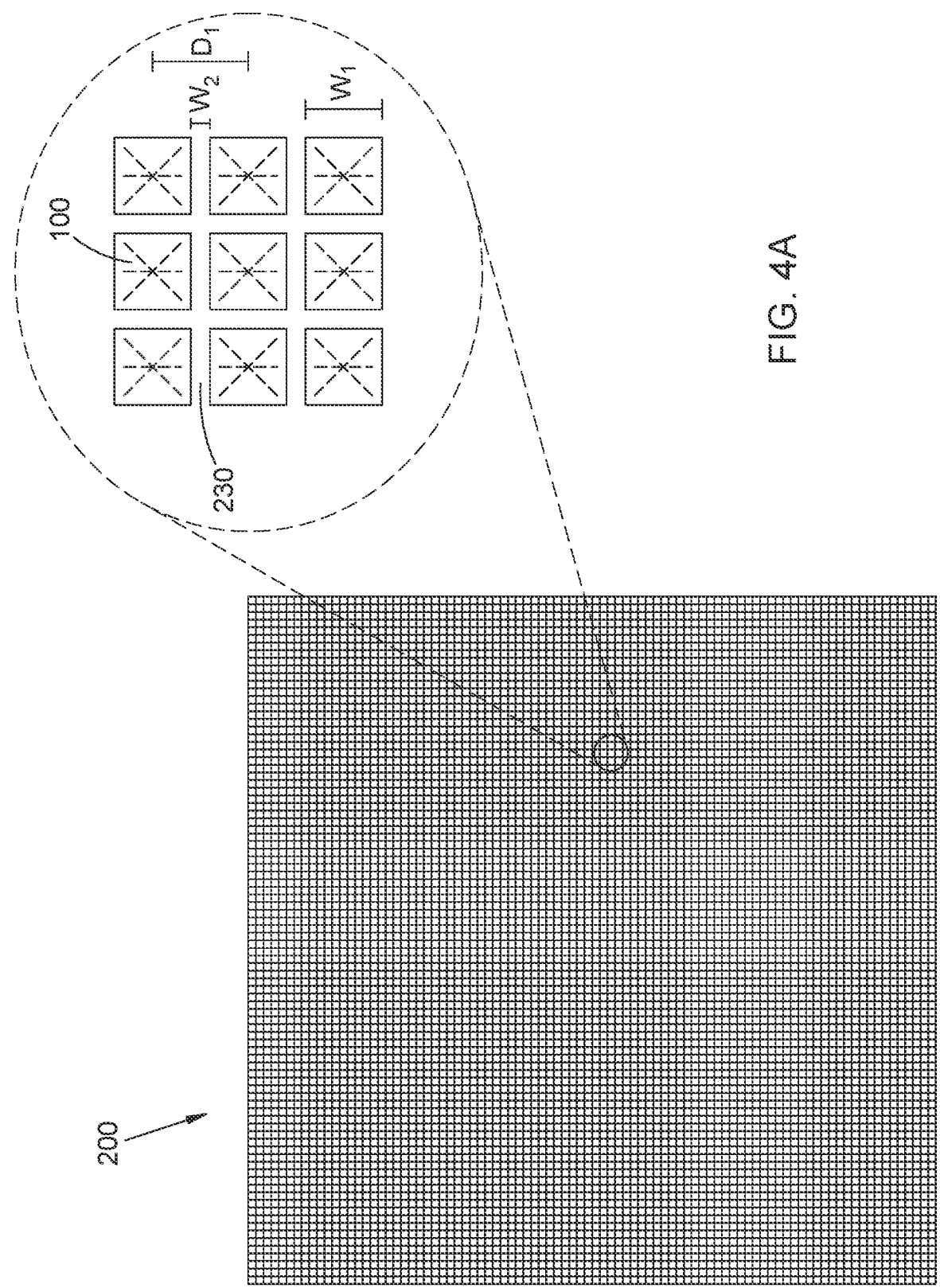
FIG. 4A shows a top schematic view of an example miniLED or microLED array and an enlarged section of 3×3 LEDs of the array.

Although FIGS. 2A and 2B show a 3×3 array of nine pcLEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch or spacing $D_1$ is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
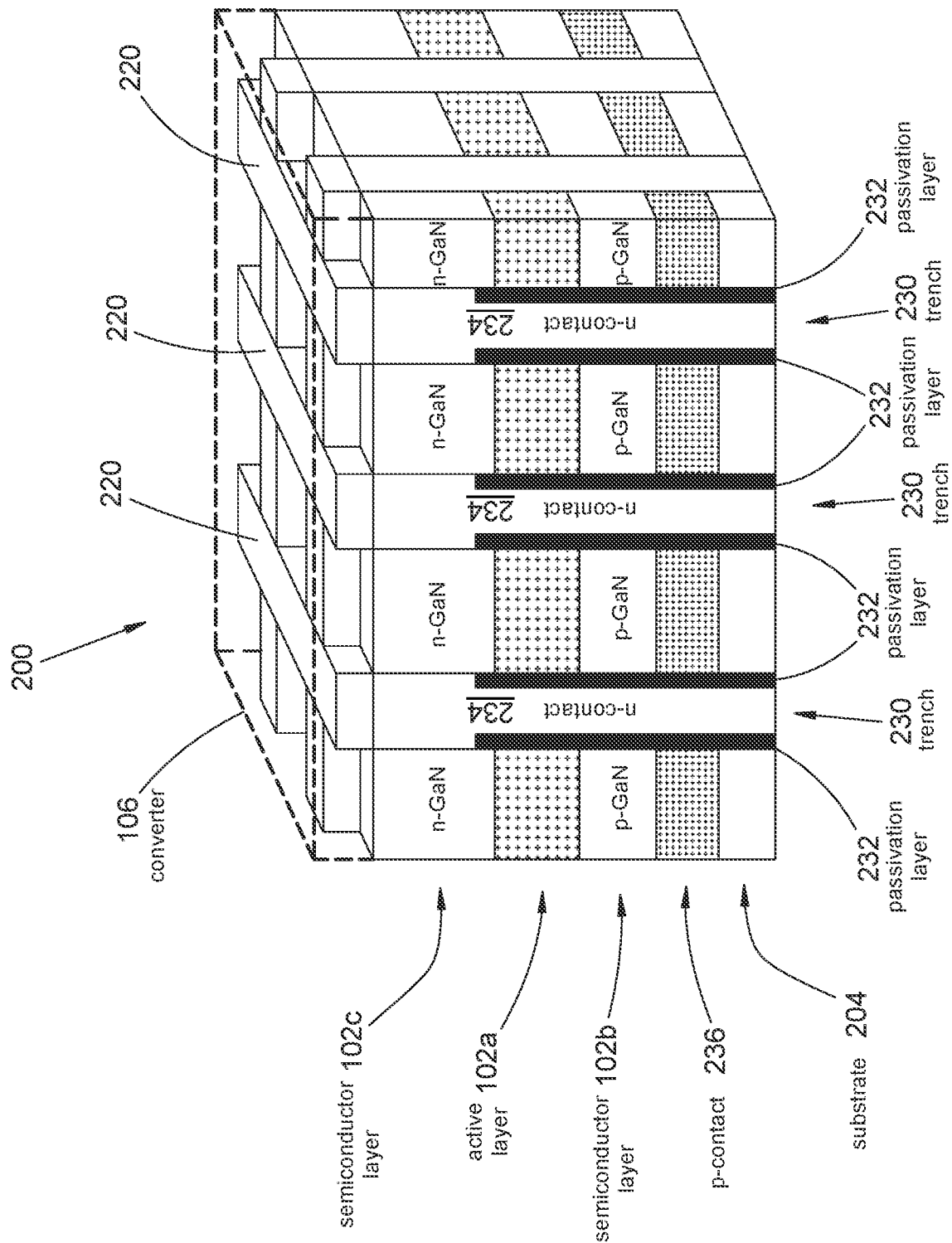
FIG. 4B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102*b*, an active region 102*a*, and an n-GaN semiconductor layer 102*c*; the layers 102*a*/102*b*/102*c* collectively form the semiconductor LED 102. A wavelength converter material 106 may be deposited on the semiconductor layer 102*c* (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

Figure 4C:
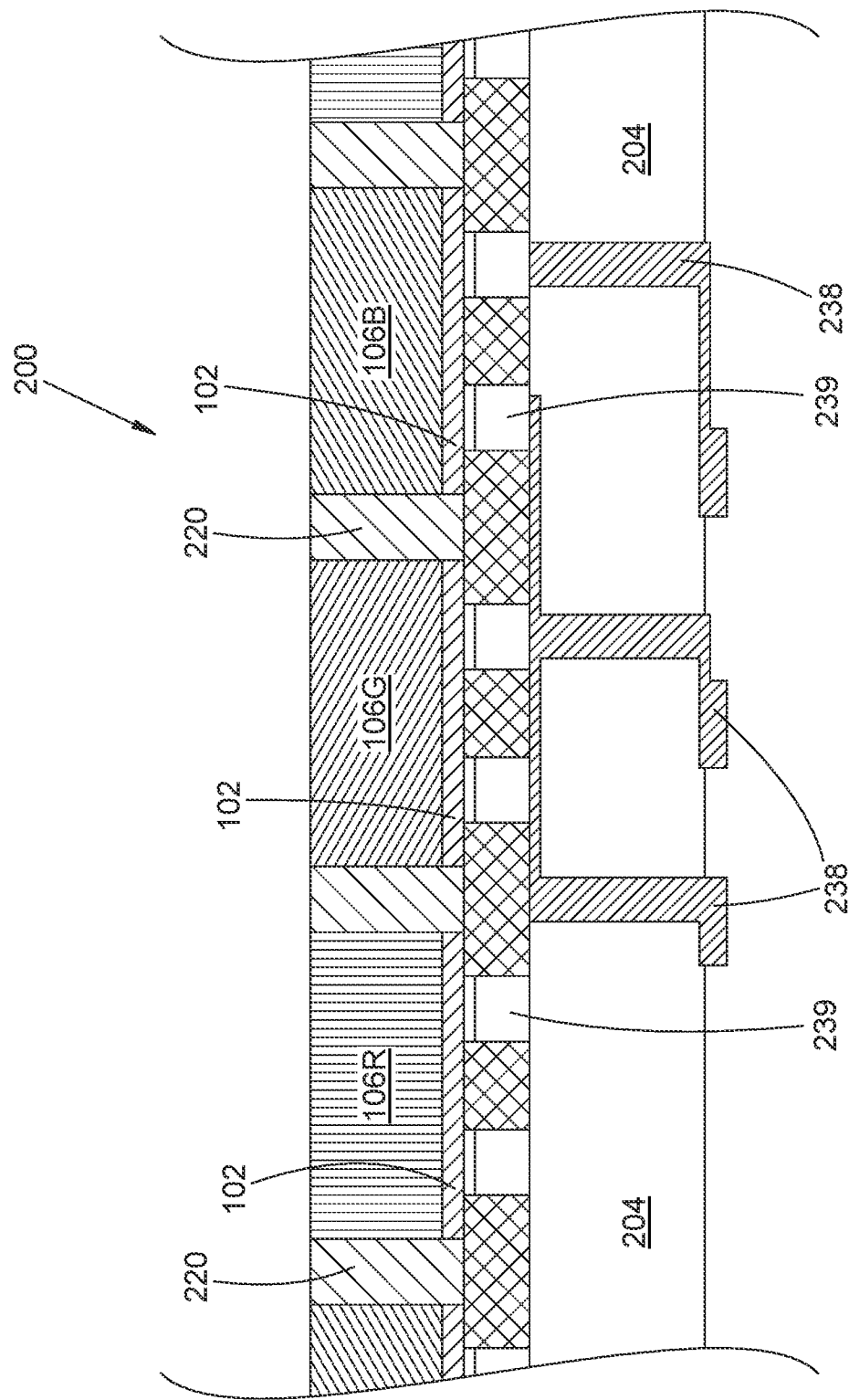
FIG. 4C is a side cross-sectional schematic diagram of an example of a close-packed array of multi-colored phosphor-converted LEDS on a monolithic die and substrate.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

An array of independently operable LEDs or pcLEDs may be used in combination with a lens, lens system, or other optic or optical system (e.g., as described above) to provide illumination that is adaptable for a particular purpose. For example, in operation such an adaptive lighting system may provide illumination that varies by color and/or intensity across an illuminated scene or object and/or is aimed in a desired direction. Beam focus or steering of light emitted by the LED or pcLED array can be performed electronically by activating LEDs or pcLEDs in groups of varying size or in sequence, to permit dynamic adjustment of the beam shape and/or direction without moving optics or changing the focus of the lens in the lighting apparatus. A controller can be configured to receive data indicating locations and color characteristics of objects or persons in a scene and based on that information control LEDs or pcLEDs in an array to provide illumination adapted to the scene. Such data can be provided for example by an image sensor, or optical (e.g., laser scanning) or non-optical (e.g., millimeter radar) sensors. Such adaptive illumination is increasingly important for automotive (e.g., adaptive headlights), mobile device camera (e.g., adaptive flash), AR, VR, and MR applications such as those described below.

Figure 17A:
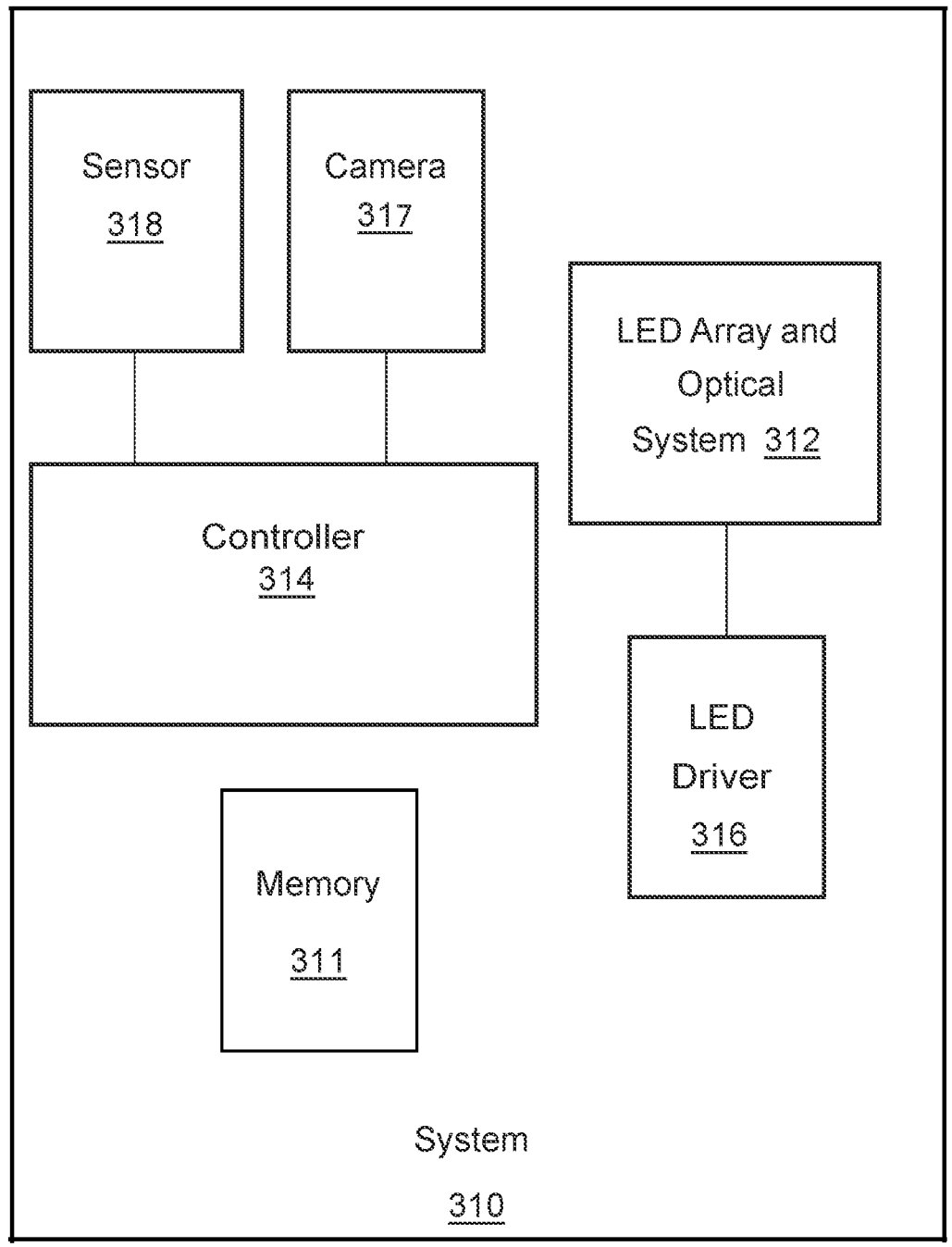
FIG. 17A schematically illustrates an example camera flash system.

FIG. 17A schematically illustrates an example camera flash system 310 comprising an LED or pcLED array and an optical (e.g., lens) system 312, which may be or comprise an adaptive lighting system as described above in which LEDs or pcLEDs in the array may be individually operable or operable as groups. In operation of the camera flash system, illumination from some or all of the LEDs or pcLEDs in array and optical system 312 may be adjusted—deactivated, operated at full intensity, or operated at an intermediate intensity. The array may be a monolithic array, or comprise one or more monolithic arrays, as described above. The array may be a microLED array, as described above.

Flash system 310 also comprises an LED driver 316 that is controlled by a controller 314, such as a microprocessor. Controller 314 may also be coupled to a camera 317 and to sensors 318 and operate in accordance with instructions and profiles stored in memory 311. Camera 317 and LED or pcLED array and lens system 312 may be controlled by controller 314 to, for example, match the illumination provided by system 312 (i.e., the field of view of the illumination system) to the field of view of camera 317, or to otherwise adapt the illumination provided by system 312 to the scene viewed by the camera as described above. Sensors 318 may include, for example, positional sensors (e.g., a gyroscope and/or accelerometer) and/or other sensors that may be used to determine the position and orientation of system 310.

Figure 17B:
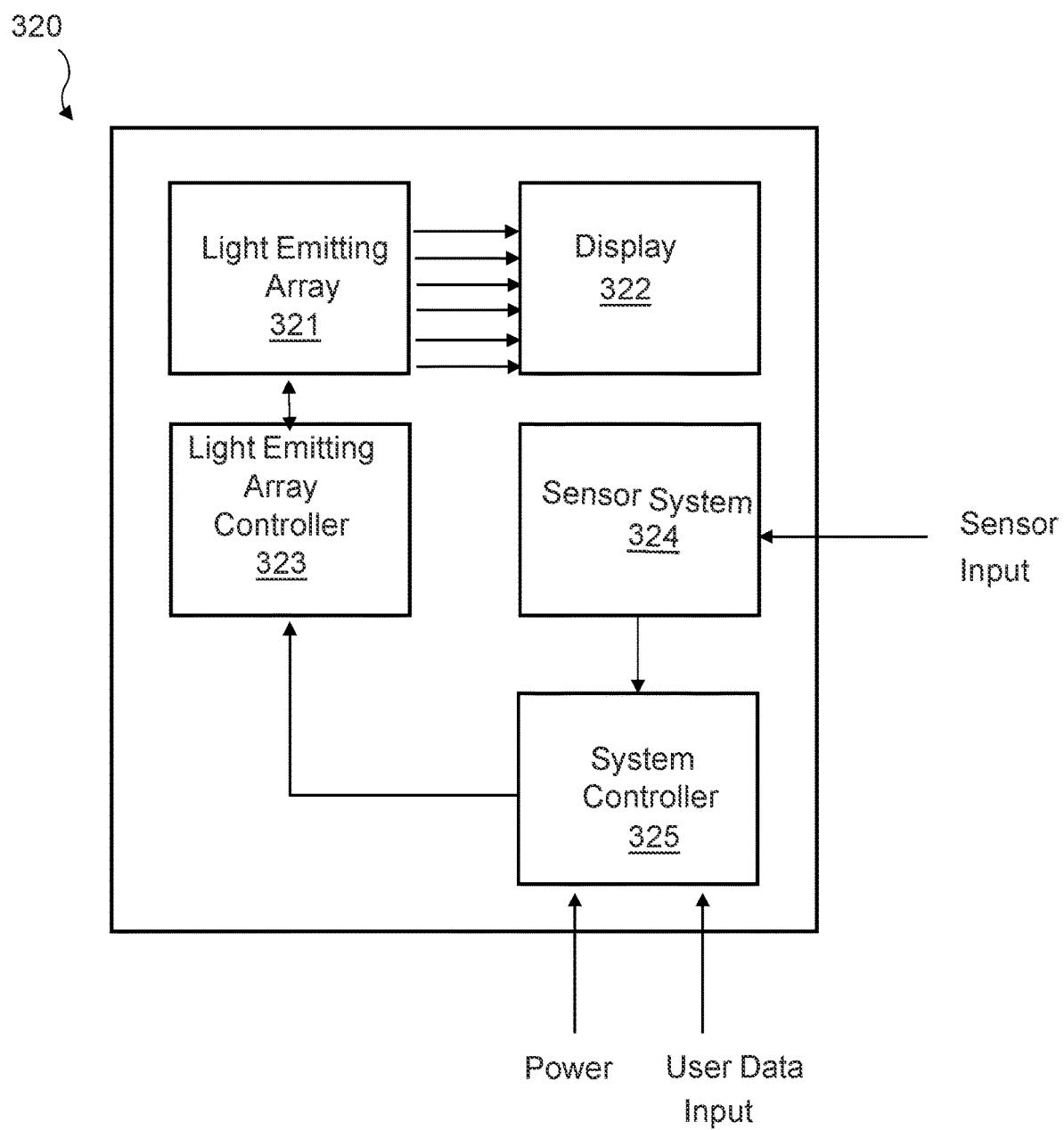
FIG. 17B schematically illustrates an example display system.

FIG. 17B schematically illustrates an example display system 320 that includes an array 321 of LEDs or pcLEDs that are individually operable or operable in groups, a display 322, a light emitting array controller 323, a sensor system 324, and a system controller 325. Array 321 may be a monolithic array, or comprise one or more monolithic arrays, as described above. The array may be monochromatic. Alternatively, the array may be a multicolor array in which different LEDs or pcLEDs in the array are configured to emit different colors of light, as described above. The array may therefore be or comprise a monolithic multicolor matrix of individually operable LED or pcLED light emitters, which may for example be microLEDs as described above. A single individually operable LED or pcLED or a group of adjacent such LEDs or pcLEDs in the array may correspond to a single pixel (picture element) in the display. For example, a group of three individually operable adjacent LEDs or pcLEDs comprising a red emitter, a blue emitter, and a green emitter may correspond to a single color-tunable pixel in the display. Similarly, to provide redundancy in the event of a defective LED or pcLED, a group of six individually operable adjacent LEDs or pcLEDs comprising two red emitters, two blue emitters, and two green emitters may correspond to a single color-tunable pixel in the display Array 321 can be used to project light in graphical or object patterns that can for example support AR/VR/MR systems.

Sensor input is provided to the sensor system 324, while power and user data input is provided to the system controller 325. In some embodiments modules included in system 320 can be compactly arranged in a single structure, or one or more elements can be separately mounted and connected via wireless or wired communication. For example, array 321, display 322, and sensor system 324 can be mounted on a headset or glasses, with the light emitting array controller and/or system controller 325 separately mounted.

System 320 can incorporate a wide range of optics (not shown) to couple light emitted by array 321 into display 322. Any suitable optics may be used for this purpose.

Sensor system 324 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input through the sensor system can include detected touch or taps, gestural input, or control based on headset or display position.

In response to data from sensor system 324, system controller 325 can send images or instructions to the light emitting array controller 323. Changes or modification to the images or instructions can also be made by user data input, or automated data input as needed. User data input can include but is not limited to that provided by audio instructions, haptic feedback, eye or pupil positioning, or connected keyboard, mouse, or game controller.

As noted above, AR, VR, and MR systems may be more generally referred to as examples of visualization systems. In a virtual reality system, a display can present to a user a view of scene, such as a three-dimensional scene. The user can move within the scene, such as by repositioning the user's head or by walking. The virtual reality system can detect the user's movement and alter the view of the scene to account for the movement. For example, as a user rotates the user's head, the system can present views of the scene that vary in view directions to match the user's gaze. In this manner, the virtual reality system can simulate a user's presence in the three-dimensional scene. Further, a virtual reality system can receive tactile sensory input, such as from wearable position sensors, and can optionally provide tactile feedback to the user.

In an augmented reality system, the display can incorporate elements from the user's surroundings into the view of the scene. For example, the augmented reality system can add textual captions and/or visual elements to a view of the user's surroundings. For example, a retailer can use an augmented reality system to show a user what a piece of furniture would look like in a room of the user's home, by incorporating a visualization of the piece of furniture over a captured image of the user's surroundings. As the user moves around the user's room, the visualization accounts for the user's motion and alters the visualization of the furniture in a manner consistent with the motion. For example, the augmented reality system can position a virtual chair in a room. The user can stand in the room on a front side of the virtual chair location to view the front side of the chair. The user can move in the room to an area behind the virtual chair location to view a back side of the chair. In this manner, the augmented reality system can add elements to a dynamic view of the user's surroundings.

Figure 17C:
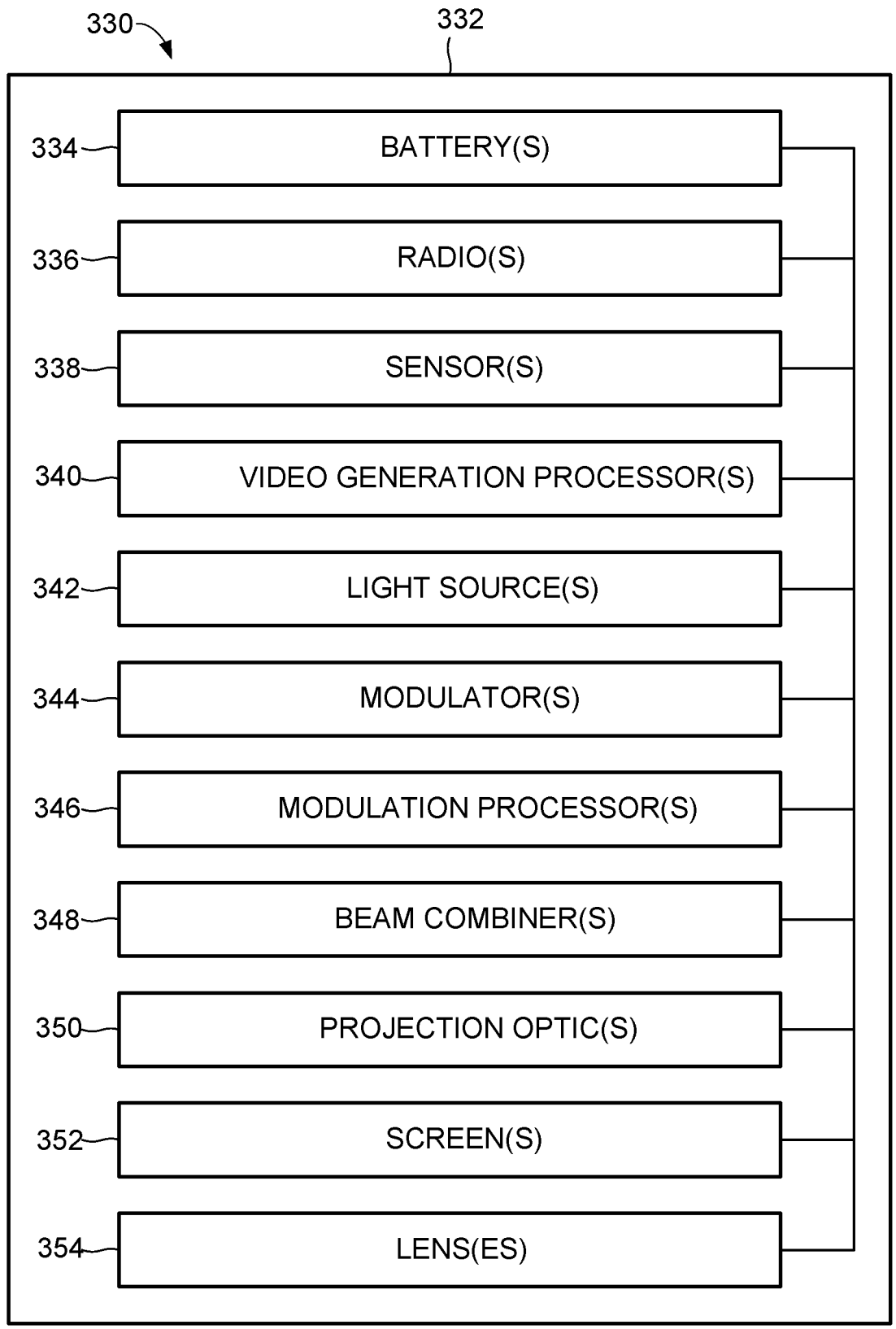
FIG. 17C shows a block diagram of an example visualization system.

FIG. 17C shows a generalized block diagram of an example visualization system 330. The visualization system 330 can include a wearable housing 332, such as a headset or goggles. The housing 332 can mechanically support and house the elements detailed below. In some examples, one or more of the elements detailed below can be included in one or more additional housings that can be separate from the wearable housing 332 and couplable to the wearable housing 332 wirelessly and/or via a wired connection. For example, a separate housing can reduce the weight of wearable goggles, such as by including batteries, radios, and other elements. The housing 332 can include one or more batteries 334, which can electrically power any or all of the elements detailed below. The housing 332 can include circuitry that can electrically couple to an external power supply, such as a wall outlet, to recharge the batteries 334. The housing 332 can include one or more radios 336 to communicate wirelessly with a server or network via a suitable protocol, such as WiFi.

The visualization system 330 can include one or more sensors 338, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 338 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 338 can capture a real-time video image of the surroundings proximate a user.

The visualization system 330 can include one or more video generation processors 340. The one or more video generation processors 340 can receive, from a server and/or a storage medium, scene data that represents a three-dimensional scene, such as a set of position coordinates for objects in the scene or a depth map of the scene. The one or more video generation processors 340 can receive one or more sensor signals from the one or more sensors 338. In response to the scene data, which represents the surroundings, and at least one sensor signal, which represents the location and/or orientation of the user with respect to the surroundings, the one or more video generation processors 340 can generate at least one video signal that corresponds to a view of the scene. In some examples, the one or more video generation processors 340 can generate two video signals, one for each eye of the user, that represent a view of the scene from a point of view of the left eye and the right eye of the user, respectively. In some examples, the one or more video generation processors 340 can generate more than two video signals and combine the video signals to provide one video signal for both eyes, two video signals for the two eyes, or other combinations.

The visualization system 330 can include one or more light sources 342 that can provide light for a display of the visualization system 330. Suitable light sources 342 can include any of the LEDs, pcLEDs, LED arrays, and pcLED arrays discussed above, for example those discussed above with respect to display system 320.

The visualization system 330 can include one or more modulators 344. The modulators 344 can be implemented in one of at least two configurations.

In a first configuration, the modulators 344 can include circuitry that can modulate the light sources 342 directly. For example, the light sources 342 can include an array of light-emitting diodes, and the modulators 344 can directly modulate the electrical power, electrical voltage, and/or electrical current directed to each light-emitting diode in the array to form modulated light. The modulation can be performed in an analog manner and/or a digital manner. In some examples, the light sources 342 can include an array of red light-emitting diodes, an array of green light-emitting diodes, and an array of blue light-emitting diodes, and the modulators 344 can directly modulate the red light-emitting diodes, the green light-emitting diodes, and the blue light-emitting diodes to form the modulated light to produce a specified image.

In a second configuration, the modulators 344 can include a modulation panel, such as a liquid crystal panel. The light sources 342 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 344 can include multiple modulation panels that can modulate different colors of light. For example, the modulators 344 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 344 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 330 can include one or more modulation processors 346, which can receive a video signal, such as from the one or more video generation processors 340, and, in response, can produce an electrical modulation signal. For configurations in which the modulators 344 directly modulate the light sources 342, the electrical modulation signal can drive the light sources 344. For configurations in which the modulators 344 include a modulation panel, the electrical modulation signal can drive the modulation panel.

The visualization system 330 can include one or more beam combiners 348 (also known as beam splitters 348), which can combine light beams of different colors to form a single multi-color beam. For configurations in which the light sources 342 can include multiple light-emitting diodes of different colors, the visualization system 330 can include one or more wavelength-sensitive (e.g., dichroic) beam splitters 348 that can combine the light of different colors to form a single multi-color beam.

The visualization system 330 can direct the modulated light toward the eyes of the viewer in one of at least two configurations. In a first configuration, the visualization system 330 can function as a projector, and can include suitable projection optics 350 that can project the modulated light onto one or more screens 352. The screens 352 can be located a suitable distance from an eye of the user. The visualization system 330 can optionally include one or more lenses 354 that can locate a virtual image of a screen 352 at a suitable distance from the eye, such as a close-focus distance, such as 500 mm, 750 mm, or another suitable distance. In some examples, the visualization system 330 can include a single screen 352, such that the modulated light can be directed toward both eyes of the user. In some examples, the visualization system 330 can include two screens 352, such that the modulated light from each screen 352 can be directed toward a respective eye of the user. In some examples, the visualization system 330 can include more than two screens 352. In a second configuration, the visualization system 330 can direct the modulated light directly into one or both eyes of a viewer. For example, the projection optics 350 can form an image on a retina of an eye of the user, or an image on each retina of the two eyes of the user.

For some configurations of augmented reality systems, the visualization system 330 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures. For purposes of the present disclosure and appended claims, a layer, structure, or material described as "transparent" and "substantially transparent" shall exhibit, at the nominal emission vacuum wavelength $\lambda_0$, a level of optical transmission that is sufficiently high, or a level of optical loss (due to absorption, scattering, or other loss mechanism) that is sufficiently low, that the light-emitting device can function within operationally acceptable parameters (e.g., output power or luminance, conversion or extraction efficiency, or other figures-of-merit including any described herein).

In many previous examples (including some of those shown above), multiple individual LED devices 102 are formed monolithically on a common layered semiconductor structure by etching trenches to form mesa-like structures separated by the trenches (e.g., as in FIG. 7). Each mesa forms a separate LED device or pixel 102, with the trenches extending through at least one (and sometimes both) of the doped semiconductor layers and the junction or active layer between them. In the example of FIG. 7, trenches extend entirely through the p-type semiconductor layer 102*b* and the active layer 102*a*, but only partly through the n-type semiconductor layer 102*c*. In this common arrangement the partly etched layer 102*c* holds the multiple LED devices 102 together in a monolithically integrated array 200. Drive current can be directed through each mesa independently of the others via traces 238, contacts 234 and 236, vias 242, and transparent electrodes 244 in the example of FIG. 7 (in which an electrically insulating dielectric layer 240 separates the contact 236 from the electrode layer 244). The surrounding trench walls laterally confine the drive current delivered to each mesa, so that the corresponding pixel 102 is independently addressable. However, as pixel sizes or spacings get smaller, a number of factors limit light output from each pixel, contrast between adjacent pixels 102, or both.

One such factor is decreased internal quantum efficiency of light emission due to non-radiative carrier recombination at defect sites at the etched sidewalls. Such defects are an unavoidable byproduct of the etch process, and their relative importance increases with decreasing pixel size; as transverse pixel size decreases, sidewall perimeter decreases linearly while emission area decreases quadratically. For pixel sizes greater than, e.g., 50 or 100 µm across, the effect of recombination at sidewall defects is relatively unimportant, or at least tolerable. As pixel size shrinks to 20 µm, 10 µm, or even less, a greater fraction of overall carrier recombination is non-radiative recombination at the sidewalls, and internal quantum efficiency suffers accordingly.

Another factor is increasingly difficult light extraction as pixel size decreases. A common method for increasing light extraction from a semiconductor LED is to provide texturing of the light-exit surface of the device. Such texturing can be formed by growing the semiconductor layers on a substrate having corrugations or other similar surface structural features, or by depositing a layer of scattering particles on the light-exit surface. However, the resulting structures typically have feature sizes of at least several microns or several tens of microns, and so cannot be readily implemented on an LED pixel that is too small, e.g., less than 5 or 10 µm across. Even if structurally realizable at such small pixel sizes, such light-extraction surface features would severely degrade contrast between adjacent pixels. The common arrangement of FIG. 7, with inter-pixel trenches extending only partly through one of the semiconductor layers, also permits light emitted from one pixel 102 to propagate into end exit the array from a different pixel 102, as indicated by some of the heavy arrows in FIG. 7.

Accordingly, it would be desirable to provide a light-emitting device that exhibits adequate, desirable, or improved levels of internal quantum efficiency or light extraction. It would be desirable to provide a monolithic array of LED pixels, including arrays having pixels sizes less than 20 µm, 10 µm, or even 5 µm, while maintaining such levels of internal quantum efficiency or light extraction, or adequate, desirable, or improved levels of pixel contrast.

Various examples of inventive light-emitting arrays 500 are illustrated schematically (in cross-section) in FIGS. 8 through 15. The corresponding plan views are not shown; the pixels of the arrays can be arranged in any suitable way; a rectangular array is commonly employed. An inventive semiconductor light-emitting array comprising a light-emitting diode structure 502*a*/502*b*/502*c*, multiple transparent dielectric bodies 540, and multiple, independent first electrical contacts, and one or more second electrical contacts 534. First and second doped semiconductor layers 502*b* and 502*c*, respectively, are arranged for emitting light at a nominal emission vacuum wavelength $\lambda_0$. That emission results from carrier recombination at a junction or active layer 502*a* between the semiconductor layers 502*b*/502*c*. The semiconductor layers 502*b*/502*c* and the junction or active layer 502*c* are coextensive over a contiguous area of the array 500. In other words, there are no etched edges of the junction or active layer 502*a* where defect sites can induce excessive non-radiative recombination. One or more second electrical contacts 534 provide an electrical connection to the semiconductor layer 502*c*, and can be arranged in any suitable way (e.g., transparent electrode(s) at a first surface of the layer 502*c* opposite the layer 502*b*; secondary via(s) passing through and electrically insulated from the layers 502*b* and 502*a*; edge contact(s) or peripheral areal contact(s)).

In some examples the first and second semiconductor layers 502*b*/502*c* and the junction or active layer 502*a* can form a semiconductor light-emitting diode (LED) structure. In some examples the diode structure (i.e., one or more of layers 502*a*/502*b*/502*c*) can include one or more doped or undoped II-VI, or Group IV semiconductor materials or alloys or mixtures thereof. In some examples the layer 502*b* can be a p-doped semiconductor layer and the layer 502*c* can be an n-doped semiconductor layer. In some examples the junction or active layer 502*a* can include one or more p-n junctions, one or more quantum wells, one or more multi-quantum wells, or one or more quantum dots. In some examples the nominal emission vacuum wavelength $\lambda_o$ can be greater than 0.20 µm, greater than 0.4 µm, greater than 0.8 µm, less than 10. µm, less than 2.5 µm, or less than 1.0 µm. In some examples the total nonzero thickness of the semiconductor layers 502b/502c and the junction or active layer 502a can be less than 10. µm, less than 5 µm, less than 3 µm, less than 2.0 µm, less than 1.5 µm, or less than 1.0 µm. In some examples the nonzero thickness of the first semiconductor layer 502b can be less than about 1.0 µm, less than about 0.8 µm, less than about 0.5 µm, or less than about 0.3 µm.

The multiple transparent dielectric bodies 540 protruding away from the first semiconductor layer 502b from the surface opposite the second semiconductor layer 502c. On each dielectric body 540, on a first surface thereof opposite the semiconductor layer 502b, is a corresponding electrically conductive layer 536, which is in electrical contact with the semiconductor layer 502b at its first surface. Each conductive layer 536 forms at least a portion of a corresponding one of the multiple, independent first electrical contacts. Each dielectric body 540 and its corresponding first electrical contact defines a corresponding discrete, circumscribed pixel region within the contiguous area of the array 500. Each pixel region is separated from other circumscribed pixel regions of the array 500. Some of the emitted from the junction or active layer 502a in the corresponding pixel region propagates into the first semiconductor layer 502b and into the dielectric body 540, undergoes one or more internal reflections within the dielectric body 540, and propagates through the dielectric body 540, through the semiconductor layers 502b/502c (and the junction or active layer 502a between them), and out of the semiconductor layer 502c away from the first semiconductor layer 502b. A few of the many and various optical paths are illustrated schematically by the heavy arrows in FIG. 8 (omitted from the remaining figures for clarity). The dielectric body can act as an optical collector or collimator for light emitted from the layer 502a that propagates initially into the semiconductor 502b (i.e., away from the layer 502c). Such collection or (at least partial) collimation can in some instances increase extraction efficiency of emitted light or improve an angular distribution of the emitted light (e.g., often, but not always, by narrowing the angular distribution).

In some examples the nonzero spacing of the pixel regions of the array 500 can be less than 1.0 mm, less than 0.5 mm, less than 0.33 mm, less than 0.20 mm, less than 0.10 mm, less than 0.08 mm, less than 0.05 mm, less than 0.033 mm, less than 0.020 mm, or less than 0.010 mm. In some examples the nonzero separation between adjacent first electrical contacts can be less than 50 µm, less than 20. µm, less than 10. µm, less than 5 µm, less than 2.0 µm, less than 1.0 µm, or less than 0.005 µm.

In some examples the array 500 can be arranged so that some or all of the pixel regions thereof act as direct emitters, i.e., light emitted from the junction or active layer 502a being the output of those pixel regions. In some examples the array 500 can include one or more wavelength-converting structures (e.g., phosphor wavelength converters) on one or more or all of the pixel regions, so that output of those pixel regions includes down-converted light emitted by the wavelength-converting structure (with or without residual light emitted by the junction or active layer 502a). In some examples such wavelength-converting structures can all emit at the same one or more wavelengths; in other examples wavelength-converting structures of some pixel regions can emit at wavelengths different from those emitted by wavelength-converting structures of some other pixel regions. In some examples the wavelength-converting structures can be arranged as discrete elements on each pixel region; in some other examples the wavelength-converting structures can be corresponding areas of a contiguous layer over multiple pixel regions, or over all of the pixel regions.

In some examples the electrically conductive layer 536 of each first electrical contact can include one or more metals or metal alloys, e.g., one or more of aluminum, silver, or gold. In some examples the corresponding electrically conductive layers 536 of the multiple first electrical contacts can be separated from one another by air gaps or by electrically insulating material so as to substantially prevent direct electrical conduction between adjacent first electrical contacts. In some examples a set of multiple independent electrically conductive traces or interconnects 238 can be connected to the first electrical contacts (e.g., to the layers 536). In some examples each first electrical contact can be connected to a single corresponding one of the traces or interconnects 238 that is different from a corresponding trace or interconnect 238 connected to any other first electrical contact. In such examples each pixel region can be independently addressable.

In some examples each first electrical contact can include one or more corresponding electrically conductive vias 542 through the corresponding dielectric body 540. Each such via 542 provides a localized, circumscribed electrical connection between the corresponding conductive layer 536 and the semiconductor layer 502b. In some examples each electrically conductive via 542 can include one or more metals or metal alloys, e.g., one or more of aluminum, silver, or gold. In some examples the each via 542 contacts the semiconductor layer 502b directly (not shown). In other examples (e.g., as in the example of FIG. 8), each first electrical contact can include a corresponding circumscribed area of a transparent electrode layer 544 between the dielectric body 540 and the semiconductor layer 502b. The transparent electrode layer 544 is in electrical contact with the semiconductor layer 502b, and each via 542 can provide the electrical connection between the conductive layer 536 and the semiconductor layer 502b by providing an electrical connection between the conductive layer 536 and the transparent electrode layer 544. In both types of examples (direct connection between each via 542 and the layer 502b, or connection through each transparent electrode layer 544), drive current into each pixel region is laterally constrained by the localized extent of the via 542 or the electrode layer 544.

In other examples (e.g., including those shown in FIGS. 9-15) the vias 542 are omitted. Instead each first electrical contact can include a corresponding a transparent electrode layer 544 and a corresponding electrically insulating layer 546. Each transparent electrode layer 544 is positioned between the corresponding dielectric body 540 and the semiconductor layer 502b in a central area of the corresponding pixel region. Each electrically insulating layer 546 can be arranged to separate, over a peripheral area of the corresponding pixel region, the semiconductor layer 502b from the corresponding transparent electrode layer 544 and from the corresponding electrically conductive layer 536. Each transparent electrode layer 544 is in electrical contact with the semiconductor layer 502b over only a central area of the corresponding pixel region; that central area is circumscribed by the corresponding peripheral area occupied by the insulating layer 546. Each insulating layer 546 thus arranged laterally constrains drive current flow into each corresponding pixel region. That drive current flows from the electrical conductive layer 536 at the periphery of the pixel region inward along the peripheral portions of the transparent electrode layer 544 that are separated from the semiconductor layer 502b by the insulating layer 546. Upon reaching the central portion of the transparent electrode layer 544 that is in contact with the semiconductor layer 502b, the drive current can flow into and through the diode structure.

In some examples each electrically insulating layer 546 can include one or more material among: doped or undoped silicon oxide, nitride, or oxynitride; one or more doped or undoped semiconductor oxides, nitrides, or oxynitrides; or one or more doped or undoped metal oxides, nitrides, or oxynitrides. In some examples each insulating layer 546 can include oxidized or otherwise passivated material of the first semiconductor layer 502b; in other examples each insulating layer 546 can be formed from material grown, deposited, or otherwise formed on the semiconductor layer 502b. In some examples each the transparent electrode layer 544 can include one or more of indium tin oxide, indium zinc oxide, one or more other transparent conductive oxides, or combinations or mixtures thereof. In examples including transparent electrode layers 544, the corresponding transparent electrode layers 544 of the multiple first electrical contacts can be separated from one another by air gaps or by electrically insulating material so as to substantially prevent direct electrical conduction between adjacent first electrical contacts.

In some examples the nonzero thickness of the dielectric bodies 540 can be less than 10. μm, less than 5 μm, less than 3 μm, less than 2.0 μm, less than 1.5 μm, or less than 1.0 μm. In some examples the transparent dielectric bodies 540 can include one or more materials among: doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers. In some examples it can be desirable to limit refractive index contrast between the dielectric bodies and the semiconductor layer 502b, to facilitate entry if emitted light into the dielectric bodies 540 for collection, collimation, or redirection. Accordingly, in some examples the difference between respective refractive indices of the first semiconductor layer 502b and the dielectric bodies 540 can be less than 0.5, less than 0.4, less than 0.3, less than 0.2, or less than 0.1.

In some examples each dielectric body 540 can have a tapered shape that decreases in transverse area with increasing distance from the surface of the semiconductor layer 540. Such shapes can enable the dielectric bodies 540 to provide the desired collection, collimation, or redirection of emitted light. Examples of suitable shapes for the dielectric bodies 540 can include, e.g., a frusto-conical shape, a frusto-pyramidal shape, a spherical cap or frustum (i.e., spherical segment), a paraboloidal cap or frustum, a spheroidal cap or frustum, an ellipsoidal cap or frustum, or an ovoidal cap or frustum. It should be noted that the drawings show side cross-section views, and so the shapes depicted cannot be unambiguously determined. FIGS. 8 through 13 depict examples of dielectric bodies 540 characterized by single shapes that could be frusto-conical or frusto-pyramidal. In FIGS. 14 and 15 depict examples that could have rotational symmetry, or not. In some examples each dielectric body 540 can be characterized by a single shape (e.g., FIGS. 8-13 and 15). In some examples the dielectric bodies 540 can be characterized by multiple different shapes, e.g., a first shape at the base of the dielectric body 540 against the semiconductor layer 502b or transparent electrode 544, and a second shape separated from the base by the first shape. In the example of FIG. 14, the first portion of each dielectric body 540 near the base has a steeper slope than a second portion that is separated from the base by the first portion. In some examples, an angular distribution of light emitted from the layer 502a can be employed to guide the arrangement of the dielectric body 540. In a specific example, if an angular emission distribution had local maxima at two different angles, the corresponding portions of the dielectric body 540 could be arranged (e.g., by varying the slope angle) to direct corresponding portion of the angular emission distribution in corresponding desired directions. Many suitable arrangements can be employed.

Figure 9:
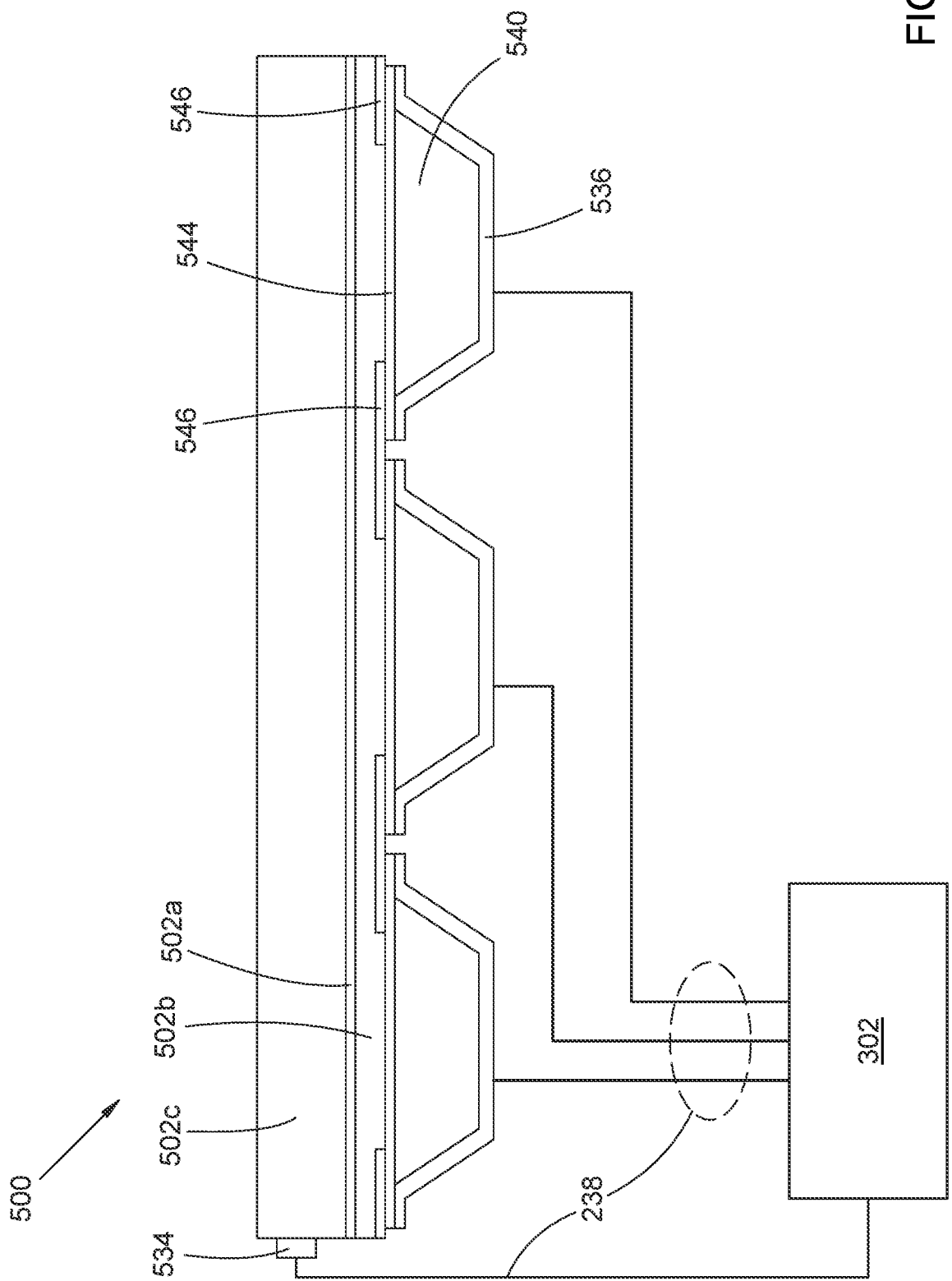
Figure 10:
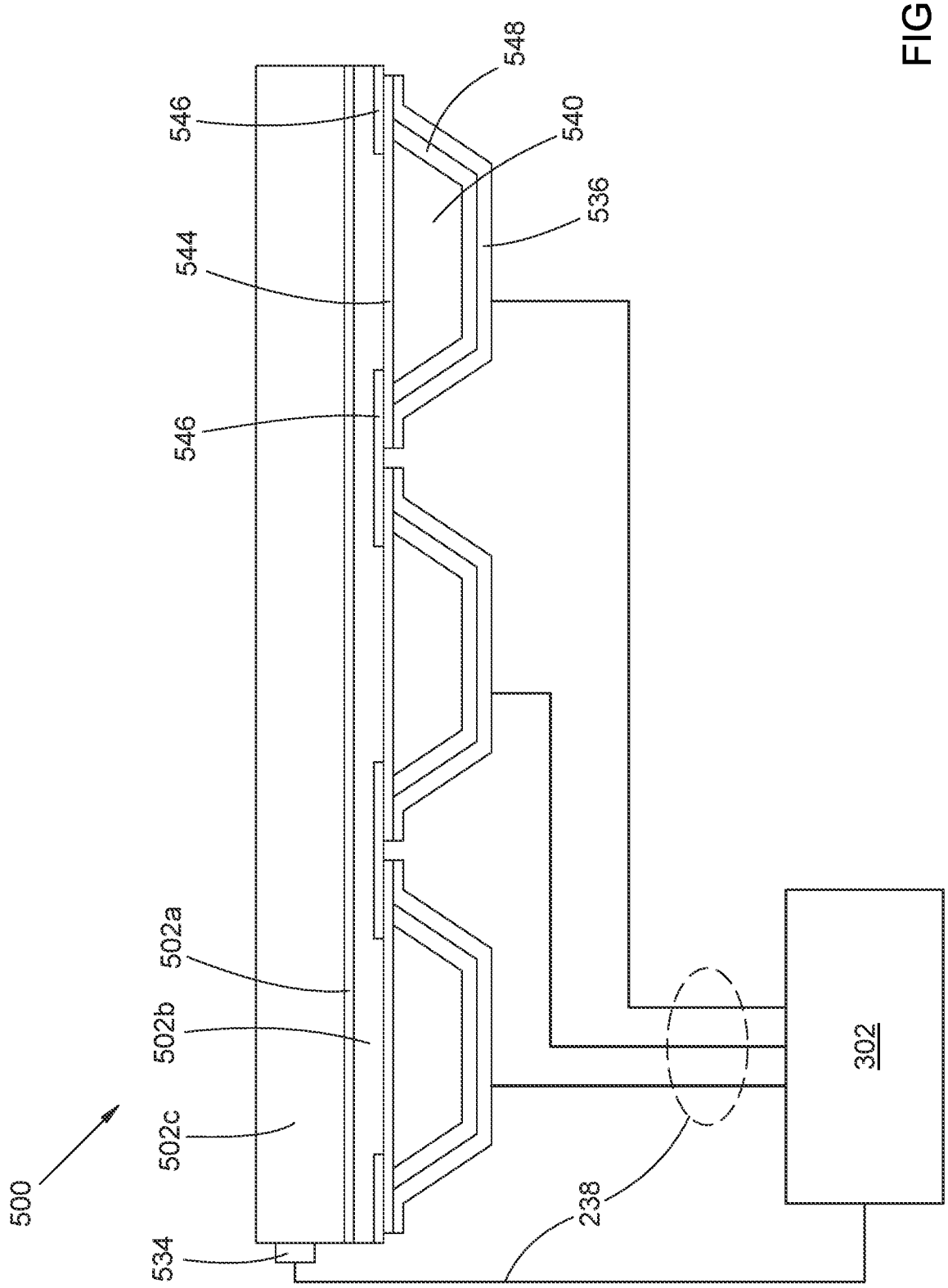

Additional elements can be added to the basic arrangements of FIG. 8 (including vias 542) and FIG. 9 (including peripheral insulator 546 and central electrode 544). Those elements are depicted in FIGS. 10-15 in combination with peripheral insulators 546 and central electrode 544, but can also be employed in combination with vias 542 (with or without transparent electrodes 544).

In the examples of FIGS. 10-15, a reflector 548 separates the electrically conductive layer 536 from the dielectric body 540, so that light propagating within the dielectric body 540 does not interact with the conductive layer 536 to a significant degree. In some examples the reflective coating can including a multilayer reflective coating such as, e.g., a distributed Bragg reflector (DBR). In some examples the reflective layer 548 can include one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

Figure 11:
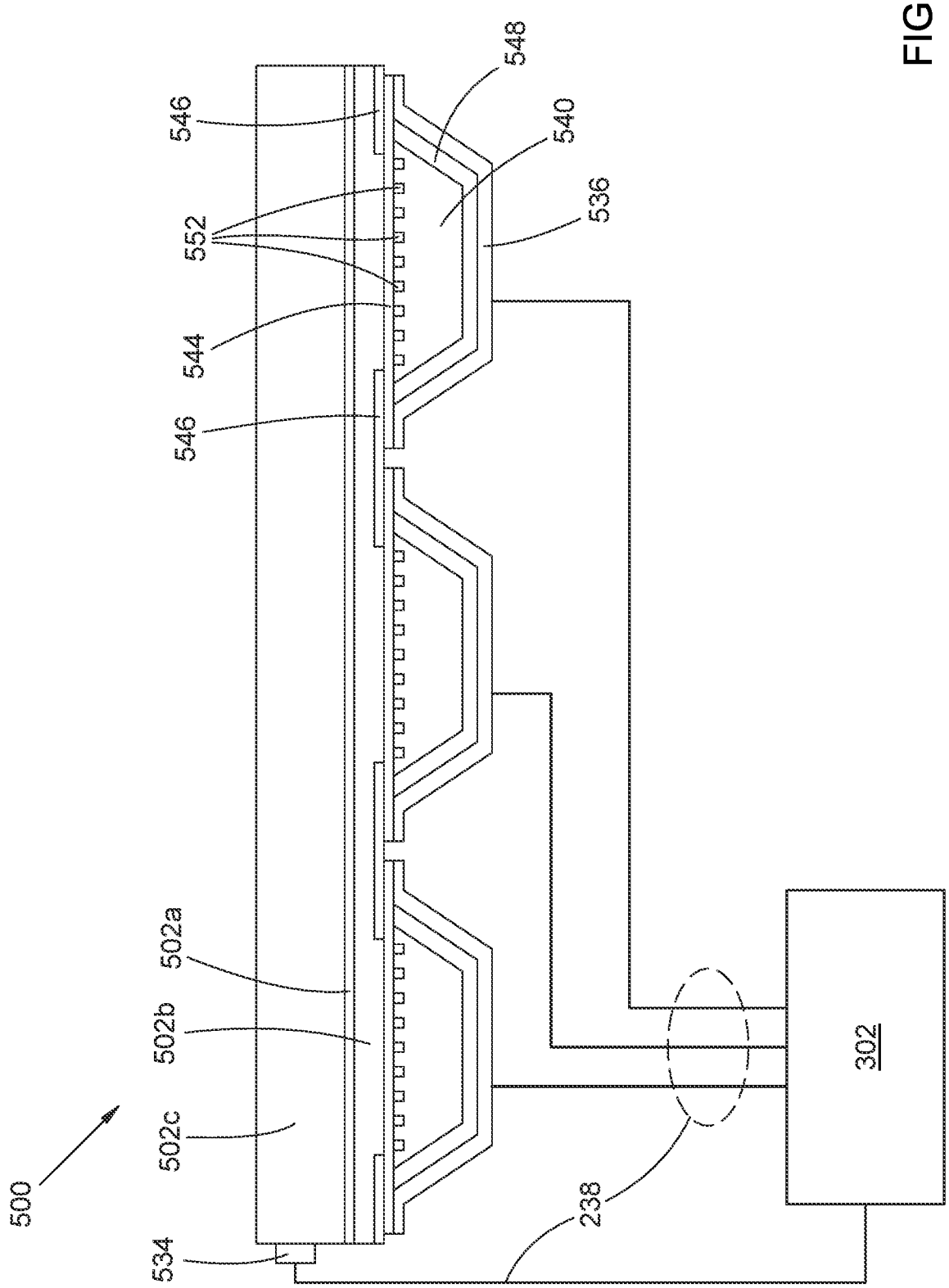
Figure 12:
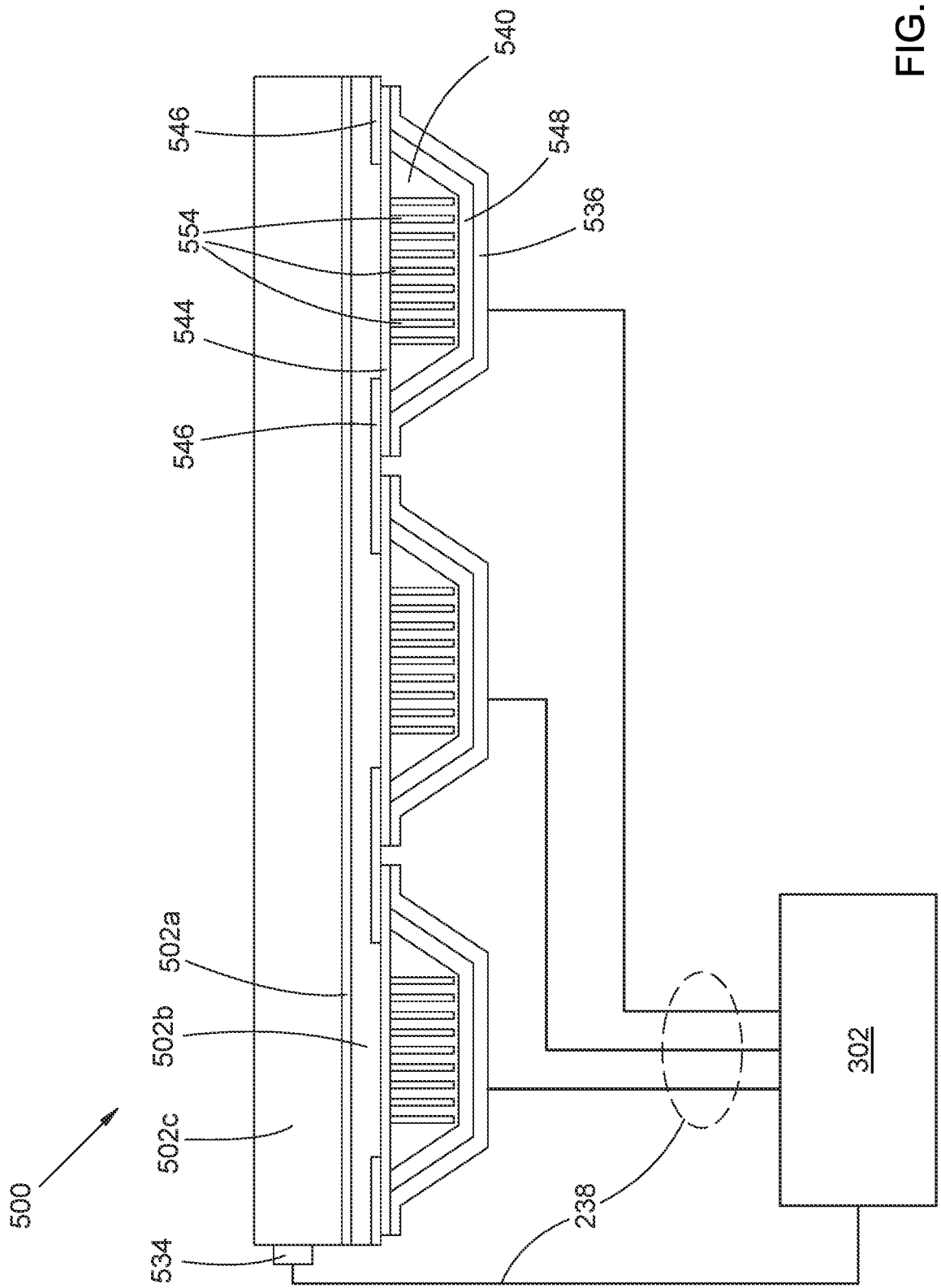
Figure 13:
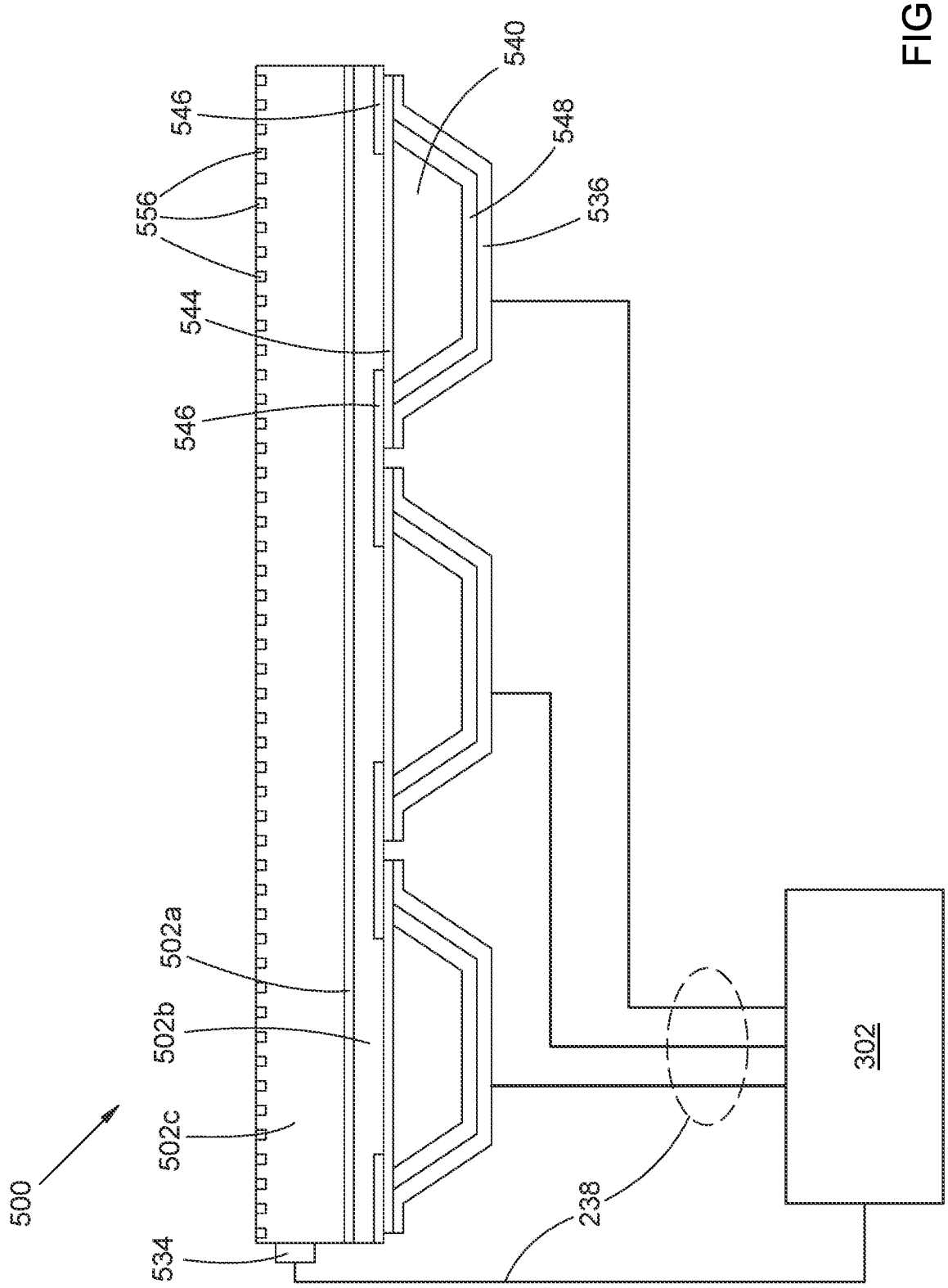
Figure 14:
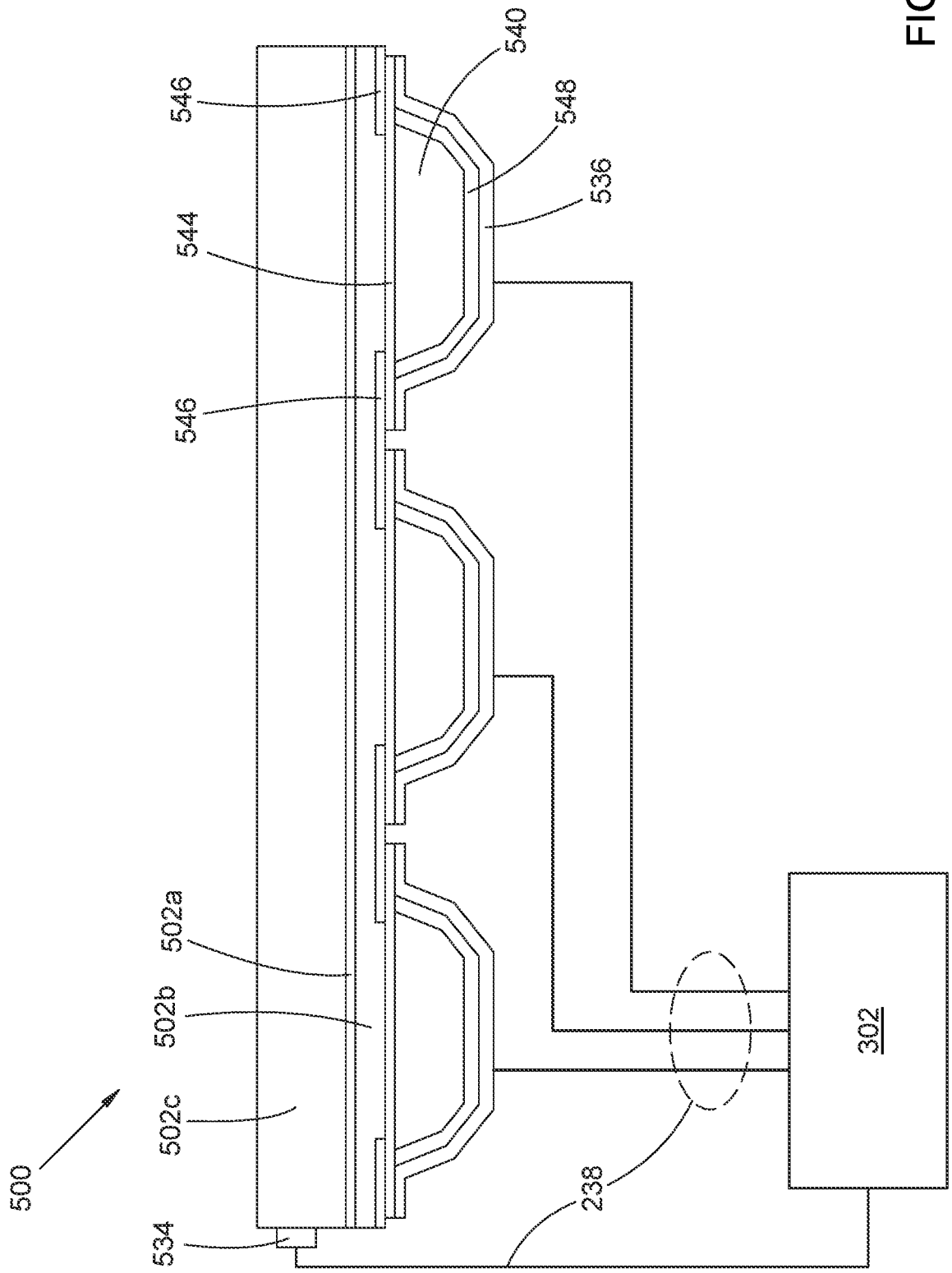
Figure 16A:
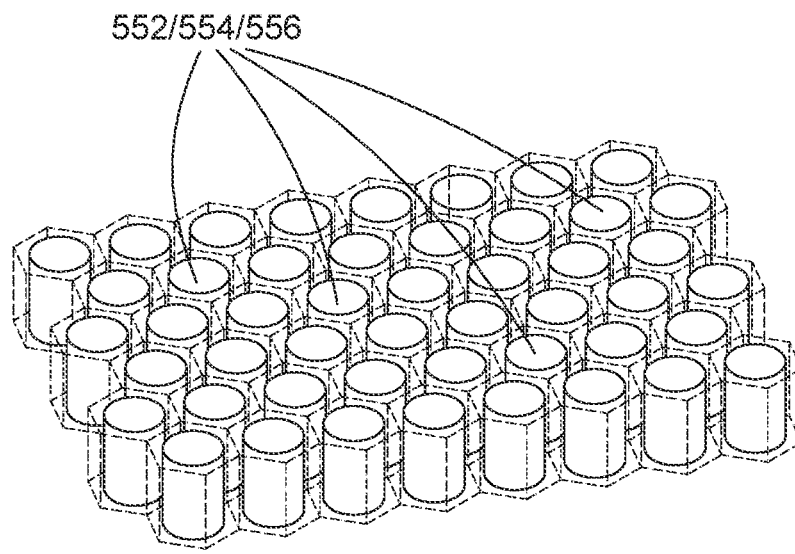
FIGS. 16A-16E illustrate schematically various examples of nanostructured optical elements.
Figure 16B:
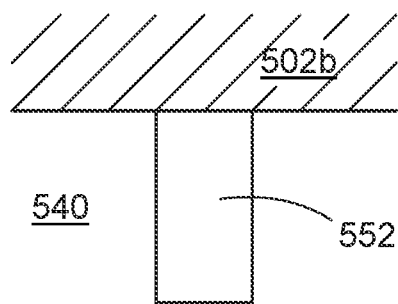
Figure 16C:
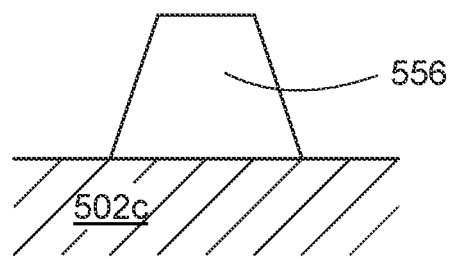
Figure 16D:
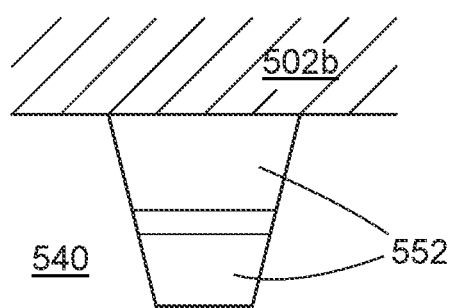
Figure 16E:
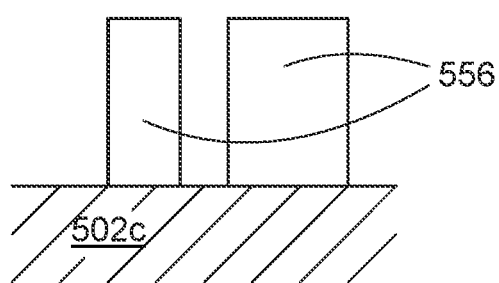

In the examples of FIGS. 11-13, sets of multiple nanostructured optical elements are depicted that can be employed to redirect emitted light within the array 500. In some examples (e.g., as in FIG. 11), an intermediate set of multiple nanostructured optical elements 552 can be positioned at the first surface of the first semiconductor layer 502b. Each nanostructured optical element 552 can be arranged as one or more volumes of dielectric material protruding into the first semiconductor layer 502b or into the corresponding dielectric body 540 of each pixel region, and can be characterized by an element size relative to the nominal emission vacuum wavelength $\lambda_0$ and by an element shape. The nanostructured optical elements 552 can be arranged as an array of elements characterized by at least one element spacing relative to the nominal emission vacuum wavelength $\lambda_0$. Size, shape, and spacing of the elements 552 can result in redirection of some of the emitted light propagating laterally within the dielectric body 540 or the diode structure to exit the array 500 through the first surface of the semiconductor layer 502c. In some examples arranged as in FIG. 11, the nanostructured elements 552 can be positioned within near-field proximity of the junction or active layer 502a, e.g., with nonzero separation between the layer 502a and the nanostructured elements 552 being less than $\lambda_0/n_{SC1}$, less than $\lambda_0/2n_{SC1}$, less than $\lambda_0/4n_{SC1}$, or less than $\lambda_0/10n_{SC1}$ ($n_{SC1}$ being the effective refractive index of the first semiconductor layer). Such near-field proximity can result in an increased Purcell factor or enhanced directionality of light emitted by the layer 502a.

In some examples (e.g., as in FIG. 12), a back set of multiple nanostructured optical elements 554 can be positioned within each dielectric body 540. Each nanostructured optical element 554 can be characterized by an element size relative to the nominal emission vacuum wavelength $\lambda_0$ and by an element shape. The nanostructured optical elements 554 can be arranged as an array of elements characterized by at least one element spacing relative to the nominal emission vacuum wavelength $\lambda_0$. Size, shape, and spacing of the elements 554 can result in redirection of some of the emitted light propagating laterally within the dielectric body 540 to exit the array 500 through the first surface of the semiconductor layer 502c.

In some examples (e.g., as in FIG. 13), a front set of multiple nanostructured optical elements 556 can be positioned at the first surface of the second semiconductor layer 502c. Each nanostructured optical element 556 can be arranged as one or more volumes of dielectric material protruding into or away from the second semiconductor layer 502c, and can be characterized by an element size relative to the nominal emission vacuum wavelength $\lambda_0$ and by an element shape. The nanostructured optical elements 556 can be arranged as an array of elements characterized by at least one element spacing relative to the nominal emission vacuum wavelength $\lambda_0$. Size, shape, and spacing of the elements 556 can result in redirection of some of the emitted light propagating laterally within the diode structure to exit the array 500 through the first surface of the semiconductor layer 502c.

Whether part of a front set, intermediate set, or back set, in some examples the nanostructured elements 552, 554, or 556 can include a multitude of suitably sized and shaped projections, holes, depressions, inclusions, or structures, or they can be arranged as an array of single or double nano-antennae, a partial photonic bandgap structure, a photonic crystal, or an array of meta-atoms or meta-molecules. Various examples are depicted schematically in FIGS. 16A-16E. In some examples size or spacing of the nanostructured elements 552, 554, or 556 can be less than $\lambda_0/n_D$, less than $\lambda_0/2n_D$, less than $\lambda_0/4n_D$, or less than $\lambda_0/10n_D$ ($n_D$ being the refractive index of the dielectric body 540). In some examples the nanostructured elements 552, 554, or 556 can include one or more materials among: one or more metals or metal alloys; doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers. In some examples the nanostructured elements 552, 554, or 556 can be arranged as a periodic array, e.g., a rectangular, hexagonal, or trigonal array. In some examples the nanostructured elements 552, 554, or 556 can be arranged in an irregular or aperiodic arrangement.

The arrangement of electrically conductive layers 536, the dielectric bodies 540 and, if present, the vias 542, transparent electrode layers 544, electrically insulating layers 546, or the nanostructured elements 552/554/556 can enable achievement of, inter alia, (i) a sufficiently large contrast ratio between adjacent pixel regions, (ii) a sufficiently large fraction of light emitted within a given pixel region to exit the array from that pixel region, or (iii) a sufficiently small fraction of light emitted within a given pixel region to exit the array from any different pixel regions. In some examples the pixel regions of the array 500 can exhibit a contrast ratio for emitted light exiting from adjacent pixel regions that is greater than 5:1, greater than 10:1, greater than 20:1, greater than 50:1, greater than 100:1, or greater than 300:1. In some examples the fraction of light emitted within each pixel region that exits the array 500 from that pixel area can be greater than 50%, greater than 75%, greater than 90%, greater than 95%, greater than 98%, or greater than 99%. In some examples the fraction of light emitted within each pixel region exits the array 500 from any different pixel region can be less than 50%, less than 25%, less than 10.%, less than 5%, less than 2.0%, or less than 1.0%.

Design or optimization one or more or all of the diode structure (layers 502a/502b/502c), the dielectric bodies 540 (size, shape, refractive index), the conductive layers 536, the vias 542 (if present), the transparent electrode layers 544 (if present), the reflectors 548 (if present), or the nanostructured elements 552/554/556 (if present) can be performed (by calculation, simulation, or iterative designing/making/testing of prototypes or test devices) based on one or more selected figures-of-merit (FOMs). Device-performance-based FOMs that can be considered can include, e.g.: (i) overall efficiency of light emission relative to input electrical current; (ii) radiated emission angular distribution of the emitted light; (iii) contrast ratio between adjacent pixel regions for light emission, or (iv) other suitable or desirable FOMs. Instead or in addition, reduction of cost or manufacturing complexity can be employed as an FOM in a design or optimization process. Optimization for one FOM can result in non-optimal values for one or more other FOMs. Note that a device that is not necessarily fully optimized with respect to any FOM can nevertheless provide acceptable enhancement of one or more FOMs; such partly optimized devices fall within the scope of the present disclosure or appended claims.

In some examples the light-emitting array 500 can include a set of multiple independent electrically conductive traces or interconnects 238 connected to the first electrical contacts. In some examples each first electrical contact can be connected to a single corresponding one of the traces or interconnects 238 that is different from a corresponding trace or interconnect 238 that is connected to at least one other first electrical contact. In some examples each first electrical contact can be connected to a single corresponding one of the traces or interconnects 238 that is different from all corresponding traces or interconnects 238 that are connected to any other first electrical contacts, so that the pixel regions are independently addressable. In some examples the light-emitting array 500 can include a drive circuit 302 connected, by the electrical traces or interconnects 238, to the first electrical contacts through the corresponding conductive layers 536 and to the second electrical contacts 234. The drive circuit 302 can be structured and connected so as to provide electrical drive current that flows through the array 500 and causes the array 500 to emit light. The drive circuit can be further structured and connected so that (i) corresponding portions of the electrical drive current flow through one or more corresponding pixel regions as corresponding pixel currents, and (ii) each pixel current magnitude differs from the corresponding pixel current magnitude of at least one other of the pixel regions of the array 500.

In some examples, a method for using the light-emitting array 500 (in any of the arrangements shown and described) can include selecting a first specified spatial distribution of pixel current magnitudes, and operating the drive circuit 302 to provide those pixel current magnitudes to the corresponding pixel regions of the array 500, causing the array to emit light according to a corresponding first spatial distribution of light emission intensity across the array 500. A second specified spatial distribution of pixel current magnitudes, different from the first, can then be selected, and the drive circuit 302 can be operated to provide the second specified spatial distribution of pixel current magnitudes to the pixel regions of the array 500, causing the array to emit light according to a corresponding second spatial distribution of light emission intensity across the array 500 that differs from the first spatial distribution of light emission intensity.

In addition to the preceding, the following example embodiments fall within the scope of the present disclosure or appended claims:

Example 1. A semiconductor light-emitting array comprising: (a) first and second doped semiconductor layers that are arranged for emitting light at a nominal emission vacuum wavelength $\lambda_0$ resulting from carrier recombination at a junction or active layer between the first and second semiconductor layers, the first and second semiconductor layers and the junction or active layer being coextensive over a contiguous area of the array; (b) a set of multiple transparent dielectric bodies protruding away from the first semiconductor layer from a first surface thereof opposite the second semiconductor layer; (c) on at least a portion of a surface of each dielectric body opposite the first semiconductor layer, a corresponding electrically conductive layer in electrical contact with the first semiconductor layer at the first surface thereof so as to form at least a portion of a corresponding one of multiple, independent first electrical contacts, each dielectric body and the corresponding first electrical contact defining a corresponding discrete, circumscribed pixel region within the contiguous area of the array that is separated from other circumscribed pixel regions of the array; and (d) a set of one or more second electrical contacts in electrical contact with the second semiconductor layer.

Example 2. The light-emitting array of Example 1, each dielectric body being arranged so that at least a portion of light emitted from the junction or active layer in the corresponding pixel region propagates into the first semiconductor layer and into the dielectric body, undergoes one or more internal reflections within the dielectric body, and propagates through the dielectric body, through the first and second semiconductor layers, and out of the second semiconductor layer away from the first semiconductor layer.

Example 3. The light-emitting array of any one of Examples 1 or 2, the nominal emission vacuum wavelength $\lambda_0$ being greater than 0.20 μm, greater than 0.4 μm, greater than 0.8 μm, less than 10. μm, less than 2.5 μm, or less than 1.0 μm.

Example 4. The light-emitting array of any one of Examples 1 through 3, the electrically conductive layer of each first electrical contact including one or more metals or metal alloys.

Example 5. The light-emitting array of Example 4, the electrically conductive layer of each first electrical contact including one or more of aluminum, silver, or gold.

Example 6. The light-emitting array of any one of Examples 1 through 5, the corresponding electrically conductive layers of the multiple first electrical contacts being separated from one another by air gaps or by electrically insulating material so that direct electrical conduction between adjacent first electrical contacts is substantially prevented.

Example 7. The light-emitting array of any one of Examples 1 through 6, further comprising a set of multiple independent electrically conductive traces or interconnects connected to the first electrical contacts, each first electrical contact being connected to a single corresponding one of the traces or interconnects that is different from a corresponding trace or interconnect connected to any other first electrical contact.

Example 8. The light-emitting array of any one of Examples 1 through 7, each first electrical contact including one or more corresponding electrically conductive vias through the corresponding dielectric body, each via providing a localized, circumscribed electrical connection between the corresponding conductive layer and the first semiconductor layer.

Example 9. The light-emitting array of Example 8, the one or more electrically conductive vias of each first electrical contact including one or more metals or metal alloys.

Example 10. The light-emitting array of Example 9, the one or more electrically conductive vias of each first electrical contact including one or more of aluminum, silver, or gold.

Example 11. The light-emitting array of any one of Examples 8 through 10, each first electrical contact including a corresponding circumscribed area of a transparent electrode layer between the corresponding dielectric body and the first semiconductor layer and in electrical contact with the first semiconductor layer, each via providing the electrical connection between the corresponding conductive layer and the first semiconductor layer by providing an electrical connection between the corresponding conductive layer and the corresponding electrode layer.

Example 12. The light-emitting array of any one of Examples 1 through 7, each first electrical contact including (i) a corresponding transparent electrode layer between the corresponding dielectric body and the first semiconductor layer, and (ii) a corresponding electrically insulating layer arranged so as to separate, over a peripheral area of the corresponding pixel region, the first semiconductor layer from the corresponding transparent electrode layer and from the corresponding electrically conductive layer, the transparent electrode layer being in electrical contact with the first semiconductor layer over only a central area of the corresponding pixel region that is circumscribed by the corresponding peripheral area.

Example 13. The light-emitting array Example 12, each electrically insulating layer including one or more material among: doped or undoped silicon oxide, nitride, or oxynitride; one or more doped or undoped semiconductor oxides, nitrides, or oxynitrides; or one or more doped or undoped metal oxides, nitrides, or oxynitrides.

Example 14. The light-emitting array of any one of Examples 12 or 13, each insulating layer including oxidized or passivated material of the first semiconductor layer.

Example 15. The light-emitting array of any one of Examples 11 through 14, the transparent electrode layer of each first electrical contact including one or more of indium tin oxide, indium zinc oxide, one or more other transparent conductive oxides, or combinations or mixtures thereof.

Example 16. The light-emitting array of any one of Examples 11 through 15, the corresponding transparent electrode layers of the multiple first electrical contacts being separated from one another by air gaps or by electrically insulating material so that direct electrical conduction between adjacent first electrical contacts is substantially prevented.

Example 17. The light-emitting array of any one of claims 1 through 16, each dielectric body including one or more materials among: doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

Example 18. The light-emitting array of any one of Examples 1 through 17, each dielectric body having a tapered shape that decreases in transverse area with increasing distance from the first surface of the first semiconductor layer.

Example 19. The light-emitting array of Example 18, each dielectric body including a frusto-conical shape or a frusto-pyramidal shape.

Example 20. The light-emitting array of any one of Examples 18 or 19, each dielectric body including a shape of a spherical cap or frustum, a paraboloidal cap or frustum, a spheroidal cap or frustum, an ellipsoidal cap or frustum, or an ovoidal cap or frustum.

Example 21. The light-emitting array of any one of Examples 18 through 20, each dielectric body including a first portion with a first shape and a second portion with a second shape different from the first shape, the first portion being between the second portion and the first semiconductor layer.

Example 22. The light-emitting array of Example 21, the first and second shapes being arranged so as to redirect corresponding first and second portions of an angular distribution of emitting light to propagate in corresponding selected directions to exit the dielectric body and propagate toward the second semiconductor layer.

Example 23. The light-emitting array of any one of Examples 1 through 22, thickness of the dielectric bodies being less than 10. µm, less than 5 µm, less than 3 µm, less than 2.0 µm, less than 1.5 µm, or less than 1.0 µm.

Example 24. The light-emitting array of any one of Examples 1 through 23, a difference between respective refractive indices of the first semiconductor layer and the dielectric bodies being less than 0.5, less than 0.4, less than 0.3, less than 0.2, or less than 0.1.

Example 25. The light-emitting array of any one of Examples 1 through 24, further comprising on each dielectric body a corresponding reflective coating between the dielectric body and the corresponding electrically conductive layer of the corresponding first electrical contact.

Example 26. The light-emitting array of Example 25, the reflective coating including a multilayer reflective coating or a distributed Bragg reflector (DBR).

Example 27. The light-emitting array of any one of Examples 25 or 26, the reflective coating including one or more materials among: one or more metals or metal alloys; doped or undoped silicon; one or more doped or undoped II-VI, or Group IV semiconductors; doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

Example 28. The light-emitting array of any one of Examples 1 through 27, further comprising: (i) an intermediate set of multiple nanostructured optical elements positioned at the first surface of the first semiconductor layer, with each nanostructured optical element of the intermediate set being arranged as one or more volumes of dielectric material protruding into the first semiconductor layer or into the corresponding dielectric body of each pixel region and being characterized by an element size relative to the nominal emission vacuum wavelength $\lambda_0$ and by an element shape; (ii) the intermediate set of multiple nanostructured optical elements being arranged as an array of elements characterized by at least one element spacing relative to the nominal emission vacuum wavelength $\lambda_0$; and (iii) the element size and shape and the at least one element spacing of the intermediate set resulting in the redirection of at least a portion of light at the nominal emission vacuum wavelength $\lambda_0$ propagating laterally within the dielectric body or first or second semiconductor layers to exit the array through a first surface of the second semiconductor layer.

Example 29. The light-emitting array of Example 28, the intermediate set of multiple nanostructured elements being positioned within near-field proximity of the junction or active layer.

Example 30. The light-emitting array of Example 29, nonzero separation between the junction or active layer and the intermediate set of nanostructured elements being less than $\lambda_0/n_{SC1}$, less than $\lambda_0/2n_{SC1}$, less than $\lambda_0/4n_{SC1}$, or less than $\lambda_0/10n_{SC1}$, $n_{SC1}$ being the effective refractive index of the first semiconductor layer.

Example 31. The light-emitting array of any one of Examples 1 through 30, further comprising: (i) a back set of multiple nanostructured optical elements positioned within each of the dielectric bodies and being characterized by an element size relative to the nominal emission vacuum wavelength $\lambda_0$ and by an element shape; (ii) the back set of multiple nanostructured optical elements being arranged as an array of elements characterized by at least one element spacing relative to the nominal emission vacuum wavelength $\lambda_0$; and (iii) the element size and shape and the at least one element spacing of the back set resulting in the redirection of at least a portion of light at the nominal emission vacuum wavelength $\lambda_0$ propagating within the dielectric body to exit the array through the second semiconductor layer.

Example 32. The light-emitting array of any one of Examples 1 through 31, further comprising: (i) a front set of multiple nanostructured optical elements positioned at a first surface of the second semiconductor layer opposite the first semiconductor layer, with each nanostructured optical element of the front set being arranged as one or more volumes of dielectric material protruding into or away from the second semiconductor layer and being characterized by an element size relative to the nominal emission vacuum wavelength $\lambda_0$ and by an element shape; (ii) the front set of multiple nanostructured optical elements being arranged as an array of elements characterized by at least one element spacing relative to the nominal emission vacuum wavelength $\lambda_0$; and (iii) the element size and shape and the at least one element spacing of the front set resulting in the redirection of at least a portion of light at the nominal emission vacuum wavelength $\lambda_0$ propagating laterally within the first or second semiconductor layers to exit the array through the first surface of the second semiconductor layer.

Example 33. The light-emitting array of any one of Examples 28 through 32, the nanostructured elements of one or more of the front, back, or intermediate sets including a multitude of suitably sized and shaped projections, holes, depressions, inclusions, or structures.

Example 34. The light-emitting array of any one of Examples 28 through 33, the nanostructured elements of one or more of the front, back, or intermediate sets including an array of single or double nano-antennae, a partial photonic bandgap structure, a photonic crystal, or an array of meta-atoms or meta-molecules.

Example 35. The light-emitting array of any one of Examples 28 through 34, nonzero size or spacing of the nanostructured elements of one or more of the front, intermediate, or back sets being less than $\lambda_0/n_D$, less than $\lambda_0/2n_D$, less than $\lambda_0/4n_D$, or less than $\lambda_0/10n_D$, $n_D$ being the refractive index of the dielectric body.

Example 36. The light-emitting array of any one of Examples 28 through 35, the nanostructured elements of one or more of the front, intermediate, or back sets including one or more materials among: one or more metals or metal alloys; doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

Example 37. The light-emitting array of any one of Examples 1 through 36, the first and second semiconductor layers and the junction or active layer forming a semiconductor light-emitting diode structure.

Example 38. The light-emitting array of any one of Examples 1 through 37, the diode structure including one or more doped or undoped II-VI, or Group IV semiconductor materials or alloys or mixtures thereof.

Example 39. The light-emitting array of any one of Examples 1 through 38, the junction or active layer including one or more doped or undoped II-VI, or Group IV semiconductor materials or alloys or mixtures thereof.

Example 40. The light-emitting array of any one of Examples 1 through 39, the junction or active layer including one or more p-n junctions, one or more quantum wells, one or more multi-quantum wells, or one or more quantum dots.

Example 41. The light-emitting array of any one of Examples 1 through 40, the pixel regions of the array exhibiting a contrast ratio for emitted light exiting from adjacent pixel regions that is greater than 5:1, greater than 10:1, greater than 20:1, greater than 50:1, greater than 100:1, or greater than 300:1.

Example 42. The light-emitting array of any one of Examples 1 through 41, nonzero spacing of the pixel regions of the array being less than 1.0 mm, less than 0.5 mm, less than 0.33 mm, less than 0.20 mm, less than 0.10 mm, less than 0.08 mm, less than 0.05 mm, less than 0.033 mm, less than 0.020 mm, or less than 0.010 mm.

Example 43. The light-emitting array of any one of Examples 1 through 42, nonzero separation between adjacent first electrical contacts being less than 50 µm, less than 20. µm, less than 10. µm, less than 5 µm, less than 2.0 µm, less than 1.0 µm, or less than 0.005 µm.

Example 44. The light-emitting array of any one of Examples 1 through 43, nonzero total thickness of the first and second semiconductor layers and the junction or active layer being less than 10. µm, less than 5 µm, less than 3 µm, less than 2.0 µm, less than 1.5 µm, or less than 1.0 µm.

Example 45. The light-emitting array of any one of Examples 1 through 44, nonzero thickness of the first semiconductor layer being less than 1.0 µm, less than 0.8 µm, less than 0.5 µm, or less than 0.3 µm.

Example 46. The light-emitting array of any one of Examples 1 through 45, the pixel regions of the array being arranged so that, of the light emitted within each pixel region at the nominal emission vacuum wavelength $\lambda_0$ and that exits the array through the second semiconductor layer, at least a specified minimum fraction of the exiting light exits from that pixel area, and the specified minimum fraction is greater than 50%, greater than 75%, greater than 90%, greater than 95%, greater than 98%, or greater than 99%.

Example 47. The light-emitting array of any one of Examples 1 through 46, the pixel regions of the array being arranged so that, of the light emitted within each pixel region at the nominal emission vacuum wavelength $\lambda_0$ and that exits the array through the second semiconductor layer, at most a specified maximum fraction of the exiting light exits the array from other, different pixel region, and the specified maximum fraction is less than 50%, less than 25%, less than 10.%, less than 5%, less than 2.0%, or less than 1.0%.

Example 48. The light-emitting array of any one of Examples 1 through 47, the set of second electrical contacts including one or more substantially transparent electrodes at a first surface of the second semiconductor layer opposite the first semiconductor layer.

Example 49. The light-emitting array of any one of Examples 1 through 48, the set of second electrical contacts being connected to the second semiconductor layer by one or more secondary vias passing through and electrically insulated from the first semiconductor layer and the junction or active layer, each secondary via providing a localized, circumscribed electrical connection between the corresponding second contact and the second semiconductor layer.

Example 50. The light-emitting array of any one of Examples 1 through 49, the set of second electrical contacts including one or more edge contacts or one or more peripheral areal contacts.

Example 51. The light-emitting array of any one of Examples 1 through 50, further comprising a set of multiple independent electrically conductive traces or interconnects connected to the first electrical contacts, each first electrical contact being connected to a single corresponding one of the traces or interconnects that is different from a corresponding trace or interconnect connected to at least one other first electrical contact.

Example 52. The light-emitting array of Example 51, further comprising a drive circuit connected to the sets of first and second electrical contacts by the electrical traces or interconnects, the drive circuit being structured and connected so as to provide electrical drive current that flows through the array and causes the array to emit light, and that is further structured and connected so that (i) corresponding portions of the electrical drive current flow through one or more corresponding pixel regions as corresponding pixel currents, and (ii) each pixel current magnitude differs from the corresponding pixel current magnitude of at least one other of the pixel regions of the array.

Example 53. A method for using the light-emitting array of Example 52, the method comprising: (A) selecting a first specified spatial distribution of pixel current magnitudes; (B) operating the drive circuit to provide the first specified spatial distribution of pixel current magnitudes to the pixel regions of the array, causing the array to emit light according to a corresponding first spatial distribution of light emission intensity across the array; (C) selecting a second specified spatial distribution of pixel current magnitudes that differs from the first specified spatial distribution of pixel current magnitudes; and (D) operating the drive circuit to provide the second specified spatial distribution of pixel current magnitudes to the pixel regions of the array, causing the array to emit light according to a corresponding second spatial distribution of light emission intensity across the array that differs from the first spatial distribution of light emission intensity.

Example 54. A method for making the light-emitting array of Example 52, the method comprising: (A) forming the first and second semiconductor layers with the junction or active layer between them; (B) forming the dielectric bodies on the first semiconductor layer; (C) forming the set of first electrical contacts in electrical contact with the first semiconductor layer; (D) forming the set of second electrical contacts in electrical contact with the second semiconductor layer; (E) forming one or more electrical traces or interconnects connected to the sets of first and second electrical contacts; and (F) connecting the drive circuit to the sets of first and second electrical contacts using the electrical traces or interconnects.

Example 55. A method for making the light-emitting array of any one of Examples 1 through 52, the method comprising: (A) forming the first and second semiconductor layers with the junction or active layer between them; (B) forming the dielectric bodies on the first semiconductor layer; (C) forming the set of first electrical contacts in electrical contact with the first semiconductor layer; and (D) forming the set of second electrical contacts in electrical contact with the second semiconductor layer.

This disclosure is illustrative and not limiting. Further modifications will be apparent to one skilled in the art in light of the present disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without any dogs, or (iv) one or more dogs, one or more cats, and one or more mice; "three or more," "four or more," and so on would be analogously interpreted.

For purposes of the present disclosure or appended claims, when a numerical quantity is recited (with or without terms such as "about equal to," "substantially equal to," "greater than about," "less than about," and so forth), standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A semiconductor light-emitting array comprising:
   first and second doped semiconductor layers that are arranged for emitting light at a nominal emission vacuum wavelength $\lambda_0$ resulting from carrier recombination at a junction or active layer between the first and second semiconductor layers, the first and second semiconductor layers and the junction or active layer being coextensive over a contiguous area of the array;
   a set of multiple transparent dielectric bodies protruding away from the first semiconductor layer from a first surface thereof opposite the second semiconductor layer;
   on at least a portion of a surface of each dielectric body opposite the first semiconductor layer, a corresponding electrically conductive layer in electrical contact with the first semiconductor layer at the first surface thereof so as to form at least a portion of a corresponding one of multiple, independent first electrical contacts, each dielectric body and the corresponding first electrical contact defining a corresponding discrete, circumscribed pixel region within the contiguous area of the array that is separated from other circumscribed pixel regions of the array; and
   a set of one or more second electrical contacts in electrical contact with the second semiconductor layer.

2. The light-emitting array of claim 1, each dielectric body being arranged so that at least a portion of light emitted from the junction or active layer in the corresponding pixel region propagates into the first semiconductor layer and into the dielectric body, undergoes one or more internal reflections within the dielectric body, and propagates through the dielectric body, through the first and second semiconductor layers, and out of the second semiconductor layer away from the first semiconductor layer.

3. The light-emitting array of claim 1, (i) each first electrical contact including one or more corresponding electrically conductive vias through the corresponding dielectric body, each via providing a localized, circumscribed electrical connection between the corresponding conductive layer and the first semiconductor layer, and (ii) each first electrical contact including a corresponding circumscribed area of a transparent electrode layer between the corresponding dielectric body and the first semiconductor layer and in electrical contact with the first semiconductor layer, each via providing the electrical connection between the corresponding conductive layer and the first semiconductor layer by providing an electrical connection between the corresponding conductive layer and the corresponding electrode layer.

4. The light-emitting array of claim 1, each first electrical contact including (i) a corresponding transparent electrode layer between the corresponding dielectric body and the first semiconductor layer, and (ii) a corresponding electrically insulating layer arranged so as to separate, over a peripheral area of the corresponding pixel region, the first semiconductor layer from the corresponding transparent electrode layer and from the corresponding electrically conductive layer, the transparent electrode layer being in electrical contact with the first semiconductor layer over only a central area of the corresponding pixel region that is circumscribed by the corresponding peripheral area.

5. The light-emitting array of claim 1, each dielectric body having a tapered shape that decreases in transverse area with increasing distance from the first surface of the first semiconductor layer.

6. The light-emitting array of claim 5, each dielectric body including one or more of: a frusto-conical shape, a frusto-pyramidal shape, a shape of a spherical cap or frustum, a shape of a paraboloidal cap or frustum, a shape of a spheroidal cap or frustum, a shape of an ellipsoidal cap or frustum, or a shape of an ovoidal cap or frustum.

7. The light-emitting array of claim 5, each dielectric body including a first portion with a first shape and a second portion with a second shape different from the first shape, the first portion being between the second portion and the first semiconductor layer, the first and second shapes being arranged so as to redirect corresponding first and second portions of an angular distribution of emitting light to propagate in corresponding selected directions to exit the dielectric body and propagate toward the second semiconductor layer.

8. The light-emitting array of claim 1, thickness of the dielectric bodies being less than 5 µm.

9. The light-emitting array of claim 1, a difference between respective refractive indices of the first semiconductor layer and the dielectric bodies being less than 0.5.

10. The light-emitting array of claim 1, further comprising on each dielectric body a corresponding reflective coating between the dielectric body and the corresponding electrically conductive layer of the corresponding first electrical contact.

11. The light-emitting array of claim 1, further comprising:
    an intermediate set of multiple nanostructured optical elements positioned at the first surface of the first semiconductor layer, with each nanostructured optical element of the intermediate set being arranged as one or more volumes of dielectric material protruding into the first semiconductor layer or into the corresponding dielectric body of each pixel region and being characterized by an element size relative to the nominal emission vacuum wavelength $\lambda_0$ and by an element shape;
    the intermediate set of multiple nanostructured optical elements being arranged as an array of elements characterized by at least one element spacing relative to the nominal emission vacuum wavelength $\lambda_0$; and
    the element size and shape and the at least one element spacing of the intermediate set resulting in the redirection of at least a portion of light at the nominal emission vacuum wavelength $\lambda_0$ propagating laterally within the dielectric body or first or second semiconductor layers to exit the array through a first surface of the second semiconductor layer.

12. The light-emitting array of claim 1, further comprising:
    a back set of multiple nanostructured optical elements positioned within each of the dielectric bodies and being characterized by an element size relative to the nominal emission vacuum wavelength $\lambda_0$ and by an element shape;
    the back set of multiple nanostructured optical elements being arranged as an array of elements characterized by at least one element spacing relative to the nominal emission vacuum wavelength $\lambda_0$; and the element size and shape and the at least one element spacing of the back set resulting in the redirection of at least a portion of light at the nominal emission vacuum wavelength $\lambda_0$ propagating within the dielectric body to exit the array through the second semiconductor layer.

13. The light-emitting array of claim 1, further comprising:

a front set of multiple nanostructured optical elements positioned at a first surface of the second semiconductor layer opposite the first semiconductor layer, with each nanostructured optical element of the front set being arranged as one or more volumes of dielectric material protruding into or away from the second semiconductor layer and being characterized by an element size relative to the nominal emission vacuum wavelength $\lambda_0$ and by an element shape;

the front set of multiple nanostructured optical elements being arranged as an array of elements characterized by at least one element spacing relative to the nominal emission vacuum wavelength $\lambda_0$; and the element size and shape and the at least one element spacing of the front set resulting in the redirection of at least a portion of light at the nominal emission vacuum wavelength $\lambda_0$ propagating laterally within the first or second semiconductor layers to exit the array through the first surface of the second semiconductor layer.

14. The light-emitting array of claim 1, the pixel regions of the array exhibiting a contrast ratio for emitted light exiting from adjacent pixel regions that is greater than 5:1.

15. The light-emitting array of claim 1, nonzero spacing of the pixel regions of the array being less than 0.10 mm, and nonzero separation between adjacent first electrical contacts being less than 20 μm.

16. The light-emitting array of claim 1, (i) nonzero total thickness of the first and second semiconductor layers and the junction or active layer being less than 10 μm, or (ii) nonzero thickness of the first semiconductor layer being less than 1.0 μm.

17. The light-emitting array of claim 1, further comprising:

a set of multiple independent electrically conductive traces or interconnects connected to the first electrical contacts, each first electrical contact being connected to a single corresponding one of the traces or interconnects that is different from a corresponding trace or interconnect connected to at least one other first electrical contact; and a drive circuit connected to the sets of first and second electrical contacts by the electrical traces or interconnects, the drive circuit being structured and connected so as to provide electrical drive current that flows through the array and causes the array to emit light, and that is further structured and connected so that (i) corresponding portions of the electrical drive current flow through one or more corresponding pixel regions as corresponding pixel currents, and (ii) each pixel current magnitude differs from the corresponding pixel current magnitude of at least one other of the pixel regions of the array.

18. A method for using the light-emitting array of claim 17, the method comprising:

(A) selecting a first specified spatial distribution of pixel current magnitudes;

(B) operating the drive circuit to provide the first specified spatial distribution of pixel current magnitudes to the pixel regions of the array, causing the array to emit light according to a corresponding first spatial distribution of light emission intensity across the array;

(C) selecting a second specified spatial distribution of pixel current magnitudes that differs from the first specified spatial distribution of pixel current magnitudes; and (D) operating the drive circuit to provide the second specified spatial distribution of pixel current magnitudes to the pixel regions of the array, causing the array to emit light according to a corresponding second spatial distribution of light emission intensity across the array that differs from the first spatial distribution of light emission intensity.

19. A method for making the light-emitting array of claim 17, the method comprising:

(A) forming the first and second semiconductor layers with the junction or active layer between them;

(B) forming the dielectric bodies on the first semiconductor layer;

(C) forming the set of first electrical contacts in electrical contact with the first semiconductor layer;

(D) forming the set of second electrical contacts in electrical contact with the second semiconductor layer;

(E) forming one or more electrical traces or interconnects connected to the sets of first and second electrical contacts; and (F) connecting the drive circuit to the sets of first and second electrical contacts using the electrical traces or interconnects.

20. A method for making the light-emitting array of claim 1, the method comprising:

(A) forming the first and second semiconductor layers with the junction or active layer between them;

(B) forming the dielectric bodies on the first semiconductor layer;

(C) forming the set of first electrical contacts in electrical contact with the first semiconductor layer; and (D) forming the set of second electrical contacts in electrical contact with the second semiconductor layer.

* * * * *